(12) United States Patent
Huang

(10) Patent No.: US 11,164,773 B2
(45) Date of Patent: Nov. 2, 2021

(54) METHOD FOR FORMING SEMICONDUCTOR DEVICE STRUCTURE WITH AIR GAP

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 87 days.

(21) Appl. No.: 16/578,814

(22) Filed: Sep. 23, 2019

(65) Prior Publication Data

US 2021/0090939 A1 Mar. 25, 2021

(51) Int. Cl.

| H01L 21/768 | (2006.01) |
|---|---|
| H01L 23/528 | (2006.01) |
| H01L 23/532 | (2006.01) |
| H01L 21/311 | (2006.01) |
| H01L 21/3213 | (2006.01) |
| H01L 27/108 | (2006.01) |

(52) U.S. Cl.
CPC .... H01L 21/7682 (2013.01); H01L 21/31111 (2013.01); H01L 21/32133 (2013.01); H01L 21/32139 (2013.01); H01L 21/76834 (2013.01); H01L 21/76885 (2013.01); H01L 23/528 (2013.01); H01L 23/53295 (2013.01); H01L 27/10885 (2013.01)

(58) Field of Classification Search
CPC ............... H01L 21/7682; H01L 23/528; H01L 23/53295; H01L 21/76885; H01L 21/31111; H01L 21/32133

See application file for complete search history.

(56) References Cited

U.S. PATENT DOCUMENTS

| 6,035,530 | A | * | 3/2000 | Hong | ................. H01L 21/7682 257/E21.581 |
|---|---|---|---|---|---|
| 9,653,348 | B1 | * | 5/2017 | Wu | .................... H01L 21/31144 |
| 2015/0126013 | A1 | | 5/2015 | Hwang et al. | |
| 2016/0027727 | A1 | | 1/2016 | Kim et al. | |
| 2016/0086966 | A1 | * | 3/2016 | Jhang | .................. H01L 21/7682 257/324 |
| 2016/0197003 | A1 | | 7/2016 | Kim | |
| 2016/0329337 | A1 | | 11/2016 | Hwang et al. | |

OTHER PUBLICATIONS

Notice of Allowance dated Jan. 29, 2021 related to Taiwanese Application No. 109116568.

* cited by examiner

*Primary Examiner* — Dung A. Le
(74) *Attorney, Agent, or Firm* — Muncy, Geissler, Olds & Lowe, P.C.

(57) ABSTRACT

A method for forming a semiconductor device structure includes the steps of: forming a conductive layer over a semiconductor substrate; forming a first dielectric structure and a second dielectric structure over the conductive layer; forming a first spacer over a sidewall of the first dielectric structure and a second spacer over a sidewall of the second dielectric structure; removing a portion of the conductive layer exposed by the first spacer and the second spacer to form a first conductive structure and a second conductive structure; and growing a third spacer over the first spacer and a fourth spacer over the second spacer such that an air gap is formed between the first conductive structure and the second conductive structure and sealed by the third spacer and the fourth spacer.

8 Claims, 20 Drawing Sheets

METHOD FOR FORMING SEMICONDUCTOR DEVICE STRUCTURE WITH AIR GAP

TECHNICAL FIELD

The present disclosure relates to a semiconductor device structure and a method for forming the same, and more particularly, to a semiconductor device structure with an air gap between conductive structures and a method for forming the same.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices performing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices becomes increasingly complicated. An increase in complexity of manufacturing and integration of the semiconductor device may cause deficiencies, such as signal interference between conductive elements. Accordingly, there is a continuous need to improve the manufacturing process of semiconductor devices so that the deficiencies can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device structure is provided. The semiconductor device structure includes a first conductive structure and a second conductive structure disposed over a semiconductor substrate. The semiconductor device structure also includes a first spacer disposed over the first conductive structure, and a second spacer disposed over the second conductive structure. The semiconductor device structure further includes a third spacer disposed over a sidewall of the first spacer, and a fourth spacer disposed over a sidewall of the second spacer. A lower portion of the third spacer adjoins a lower portion of the fourth spacer, and an air gap is covered by the lower portion of the third spacer and the lower portion of the fourth spacer.

In some embodiments, the first conductive structure and the second conductive structure are separated by the air gap.

In some embodiments, a top surface of the first conductive structure is higher than a bottom surface of the third spacer.

In some embodiments, the third spacer is separated from the top surface of the first conductive structure by the first spacer.

In some embodiments, the semiconductor device structure further comprises: a dielectric structure and a fifth spacer disposed over the first conductive structure, wherein the first spacer and the fifth spacer are over opposite sidewalls of the dielectric structure, and the first spacer and the fifth spacer are made of the same material.

In some embodiments, the semiconductor device structure further comprises: a first dielectric layer disposed over a sidewall of the first conductive structure and covered by the first spacer; and a second dielectric layer disposed over a sidewall of the second conductive structure and covered by the second spacer, wherein the first dielectric layer and the second dielectric layer are separated by the air gap.

In some embodiments, a bottom surface of the first spacer is in direct contact with the third spacer.

In another embodiment of the present disclosure, a semiconductor device structure is provided. The semiconductor device structure includes a first conductive structure and a second conductive structure disposed over a semiconductor substrate. The first conductive structure and the second conductive structure are separated by an air gap. The semiconductor device structure also includes a first spacer disposed over a top surface of the first conductive structure, and a second spacer disposed over a top surface of the second conductive structure. The semiconductor device structure further includes a third spacer disposed over the first spacer. The third spacer is separated from the top surface of the first conductive structure by the first spacer. In addition, the semiconductor device structure includes a fourth spacer disposed over the second spacer. The fourth spacer is separated from the top surface of the second conductive structure by the second spacer, and the air gap is sealed by the third spacer and the fourth spacer.

In some embodiments, an upper portion of the third spacer is separated from an upper portion of the fourth spacer, and a lower portion of the third spacer is connected to a lower portion of the fourth spacer.

In some embodiments, a bottom surface of the first spacer is higher than a bottom surface of the third spacer.

In some embodiments, the semiconductor device structure further comprises: a first dielectric structure disposed over the top surface of the first conductive structure, wherein the first spacer is enclosed by the first conductive structure, the first dielectric structure and the third spacer; and a second dielectric structure disposed over the top surface of the second conductive structure, wherein the second spacer is enclosed by the second conductive structure, the second dielectric structure and the fourth spacer.

In some embodiments, the first spacer and the second spacer include metal, poly-crystalline silicon, or a combination thereof, and the third spacer and the fourth spacer include metal nitride, metal silicide, or a combination thereof.

In one embodiment of the present disclosure, a method for forming a semiconductor device structure is provided. The method includes forming a conductive layer over a semiconductor substrate, and forming a first dielectric structure and a second dielectric structure over the conductive layer. The method also includes forming a first spacer over a sidewall of the first dielectric structure and a second spacer over a sidewall of the second dielectric structure, and removing a portion of the conductive layer exposed by the first spacer and the second spacer to form a first conductive structure and a second conductive structure. The method further includes growing a third spacer over the first spacer and a fourth spacer over the second spacer such that an air gap is formed between the first conductive structure and the second conductive structure and sealed by the third spacer and the fourth spacer.

In some embodiments, the step of forming the first spacer and the second spacer comprises: conformally depositing a spacer layer over the conductive layer, the first dielectric structure and the second dielectric structure; and partially removing the spacer layer to expose the first dielectric structure and the second dielectric structure such that the first spacer is formed facing the second spacer.

In some embodiments, the portion of the conductive layer is removed by an etching process using the first spacer, the second spacer, the first dielectric structure and the second dielectric structure as a mask, and the semiconductor substrate is exposed after the etching process is performed.

In some embodiments, a bottom portion of the third spacer is connected to a bottom portion of the fourth spacer, and an upper portion of the third spacer is separated from an upper portion of the fourth spacer.

In some embodiments, the third spacer and the fourth spacer extend between the first conductive structure and the second conductive structure such that a top surface of the first conductive structure is higher than a bottom surface of the third spacer and a bottom surface of the fourth spacer.

In some embodiments, the method for forming a semiconductor device structure further comprises: forming a first dielectric layer over a sidewall of the first conductive structure and a second dielectric layer over a sidewall of the second conductive structure by a heat treatment process before the third spacer and the fourth spacer are formed.

In some embodiments, the first dielectric layer is covered by the first spacer and the second dielectric layer is covered by the second spacer, and the air gap is enclosed by the semiconductor substrate, the first dielectric layer, the second dielectric layer, the third spacer and the fourth spacer.

In some embodiments, the method for forming a semiconductor device structure further comprises: removing the first dielectric layer and the second dielectric layer to partially expose a bottom surface of the first spacer and a bottom surface of the second spacer before the third spacer and the fourth spacer are formed, wherein the third spacer extends to cover the bottom surface of the first spacer, and the fourth spacer extends to cover the bottom surface of the second spacer.

Embodiments of a semiconductor device structure are provided in accordance with some embodiments of the disclosure. The semiconductor device structure includes a first conductive structure, a first spacer over the first conductive structure, a second conductive structure, and a second spacer over the second conductive structure. The semiconductor device structure also includes a third spacer over the first spacer and a fourth spacer over the second spacer, and an air gap is covered by lower portions of the third spacer and the fourth spacer. Therefore, the capacitance between adjacent conductive structures (i.e., the first and second conductive structures) may be reduced. As a result, the operation speeds of the semiconductor device structure may be increased, and the overall device performance may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
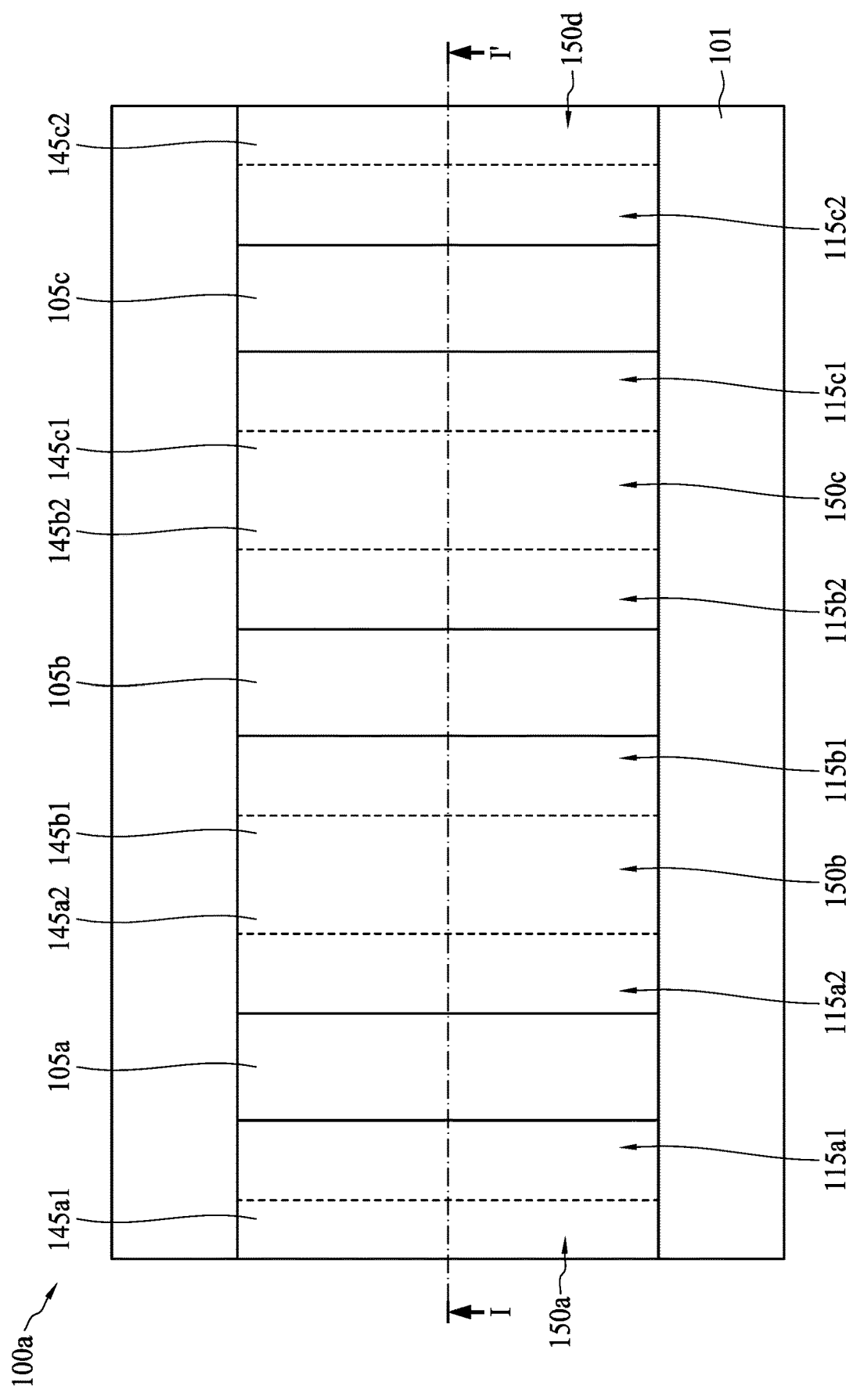
FIG. 1 is a top view illustrating a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
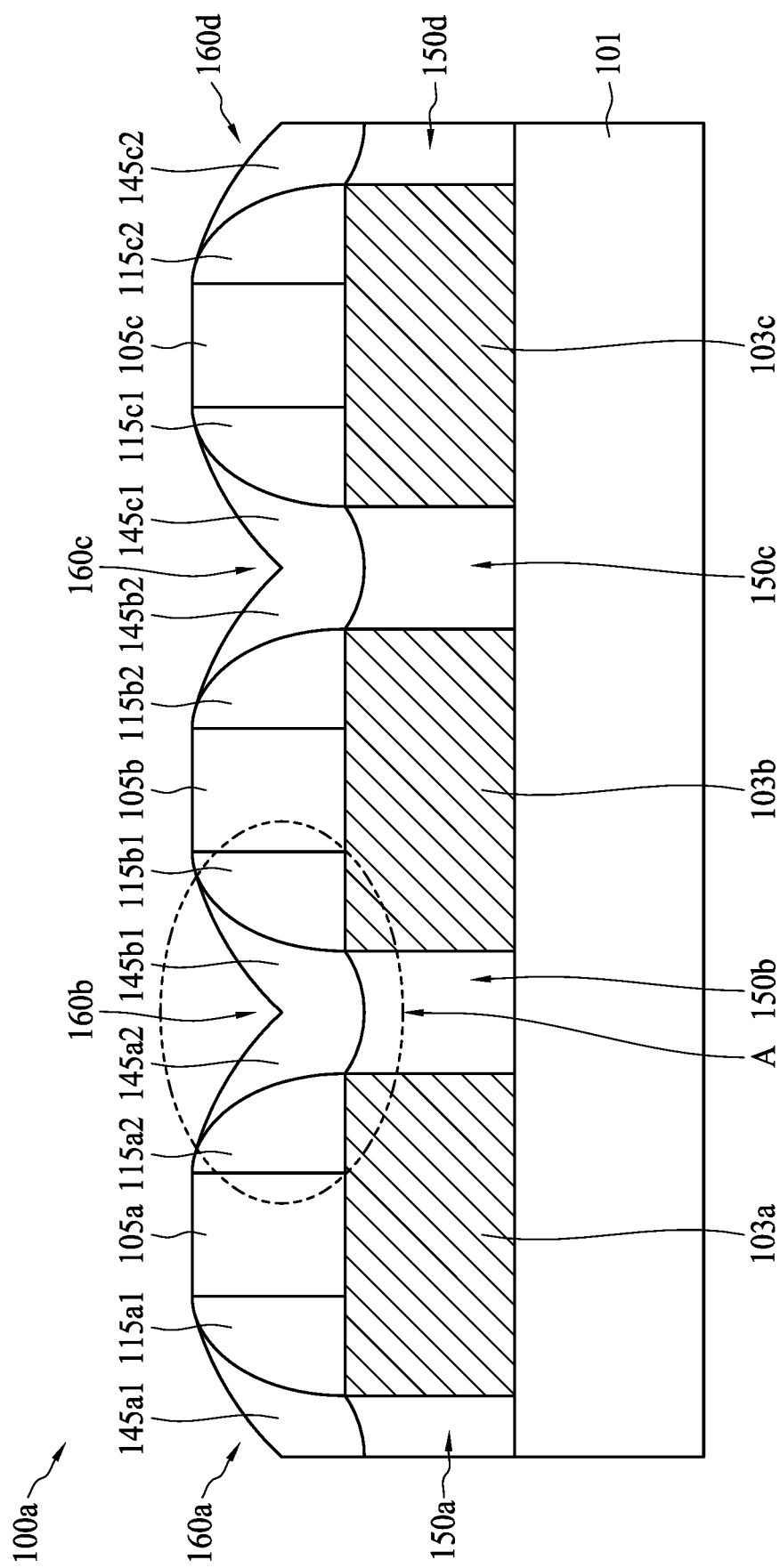
FIG. 2 is a cross-sectional view along a sectional line I-I in FIG. 1, in accordance with some embodiments.

FIG. 1 is a top view illustrating a semiconductor device structure 100a, and FIG. 2 is a cross-sectional view along the sectional line I-I' in FIG. 1, in accordance with some embodiments. As shown in FIGS. 1 and 2, the semiconductor device structure 100a includes a plurality of conductive structures 103a, 103b and 103c over a semiconductor substrate 101, and a plurality of dielectric structures 105a, 105b and 105c over the conductive structures 103a, 103b and 103c. In some embodiments, each of the dielectric structures 105a, 105b and 105c is a linear structure in the top view of FIG. 1.

Moreover, the semiconductor device structure 100a also includes a plurality of spacers 115a1, 115a2, 115b1, 115b2, 115c1 and 115c2. In some embodiments, the spacers 115a1 and 115a2 are over opposite sidewalls of the dielectric structure 105a, the spacers 115b1 and 115b2 are over opposite sidewalls of the dielectric structure 105b, and the spacers 115c1 and 115c2 are over opposite sidewalls of the dielectric structure 105c. In some embodiments, the longitudinal directions of the spacers 115a1, 115a2, 115b1, 115b2, 115c1 and 115c2 are parallel to the longitudinal directions of the dielectric structures 105a, 105b and 105c. In other words, the spacers 115a1, 115a2, 115b1, 115b2, 115c1 and 115c2 and the dielectric structures 105a, 105b and 105c extend in the same direction.

In some embodiments, the spacers 115a1, 115a2, 115b1, 115b2, 115c1 and 115c2 are referred to as a first set of spacers, and the semiconductor device structure 100a further includes a second set of spacers. The second set of spacers includes spacers 145a1, 145a2, 145b1, 145b2, 145c1 and 145c2, as shown in FIGS. 1 and 2. In some embodiments, a plurality of air gaps 150a, 150b, 150c and 150d are covered (i.e., sealed) by the spacers 145a1, 145a2, 145b1, 145b2, 145c1 and 145c2 (i.e., the second set of spacers).

In some embodiments, each of the spacers 115a1, 115a2, 115b1, 115b2, 115c1 and 115c2 (i.e., the first set of spacers) is enclosed by one of the conductive structures 103a, 103b and 103c, one of the dielectric structures 105a, 105b and 105c, and one of the spacers 145a1, 145a2, 145b1, 145b2, 145c1 and 145c2 (i.e., the second set of spacers). For example, the spacer 115a2 is enclosed by the conductive structure 103a, the dielectric structure 105a and the spacer 145a2, and the spacer 115b1 is enclosed by the conductive structure 103b, the dielectric structure 105b and the spacer 145b1, in accordance with some embodiments.

Figure 3:
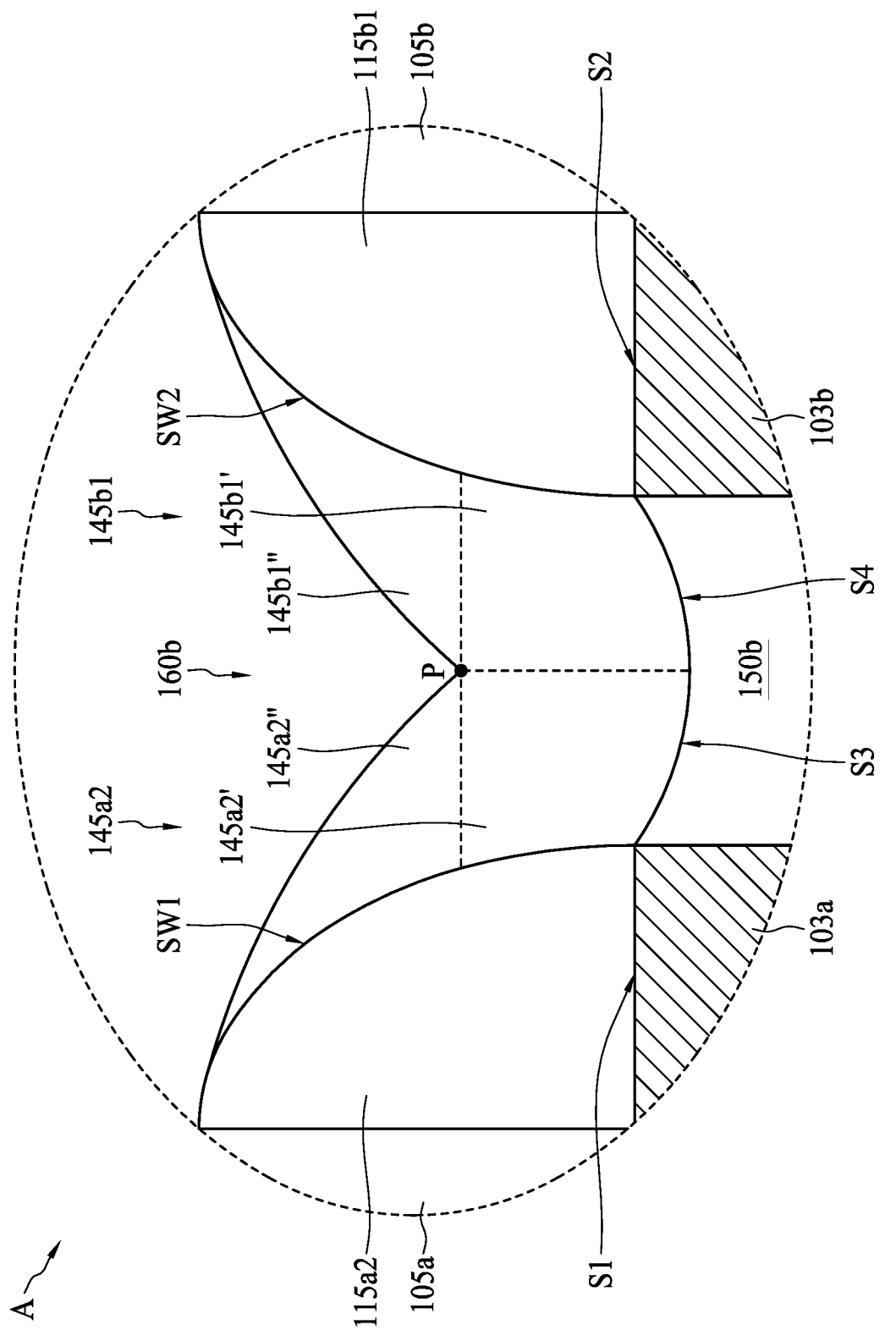
FIG. 3 is an enlarged view of region A of FIG. 2, in accordance with some embodiments.

FIG. 3 is an enlarged view of region A of FIG. 2, in accordance with some embodiments. In some embodiments, the spacer 145a2 is formed over the sidewall SW1 of the spacer 115a2, and the spacer 145b1 is formed over the sidewall SW2 of the spacer 115b1.

The spacer 145a2 includes a lower portion 145a2' and an upper portion 145a2" over the lower portion 145a2', and the spacer 145b1 includes a lower portion 145b1' and an upper portion 145b1" over the lower portion 145b1'. In some embodiments, the lower portion 145a2' adjoins (i.e., directly interfaces with) the lower portion 145b1', while the upper portion 145a2" is separated from the upper portion 145b1" by a recess 160b. In other words, the lower portion 145a2' is physically connected to the lower portion 145b1'. More specifically, the recess 160b has a lowest point P in the cross-sectional view of FIG. 3, and the lowest point P is defined as the intersection of the upper portion 145a2" of the spacer 145a2, the lower portion 145a2' of the spacer 145a2, the upper portion 145b1" of the spacer 145b1, and the lower portion 145b1' of the spacer 145b1.

It should be noted that, in some embodiments, since the spacers 145a2 and 145b1 are made of the same material, the upper portions 145a2" and 145b1", and the lower portions 145a2' and 145b1' do not have distinguishable interfaces therebetween. In addition, the lowest point P may be a line in the top view of FIG. 1.

Still referring to FIG. 3, a top surface S1 of the conductive structure 103a is higher than a bottom surface S3 of the lower portion 145a2' of the spacer 145a2, and a top surface S2 of the conductive structure 103b is higher than a bottom surface S4 of the lower portion 145b1' of the spacer 145b1, in accordance with some embodiments. In some embodiments, the conductive structures 103a and 103b directly interface with the spacers 115a2 and 115b1, respectively, the top surface S1 of the conductive structure 103a is also referred to as the bottom surface of the spacer 115a2, and the top surface S2 of the conductive structure 103b is also referred to as the bottom surface of the spacer 115b1. That is, in some embodiments, the bottom surface S1 of the spacer 115a2 is higher than the bottom surface S3 of the lower portion 145a2' of the spacer 145a2, and the bottom surface S2 of the spacer 115b1 is higher than the bottom surface S4 of the lower portion 145b1' of the spacer 145b1.

Although FIG. 3 shows only the structure between two adjacent dielectric structures 105a and 105b, the structures between other adjacent pairs of dielectric structures (e.g., dielectric structures 105b and 105c) may be similar to, or the same as, that between the dielectric structures 105a and 105b, and detailed descriptions are not repeated herein. In some embodiments, the semiconductor device structure 100a is a dynamic random access memory (DRAM), and the conductive structures 103a, 103b and 103c are bit lines (BL). In this case, the air gaps 150a, 150b, 150c and 150d are used to reduce the capacitance between adjacent bit lines, which is advantageous for increasing the operation speeds of the DRAM and improving the overall DRAM performance.

Figure 4:
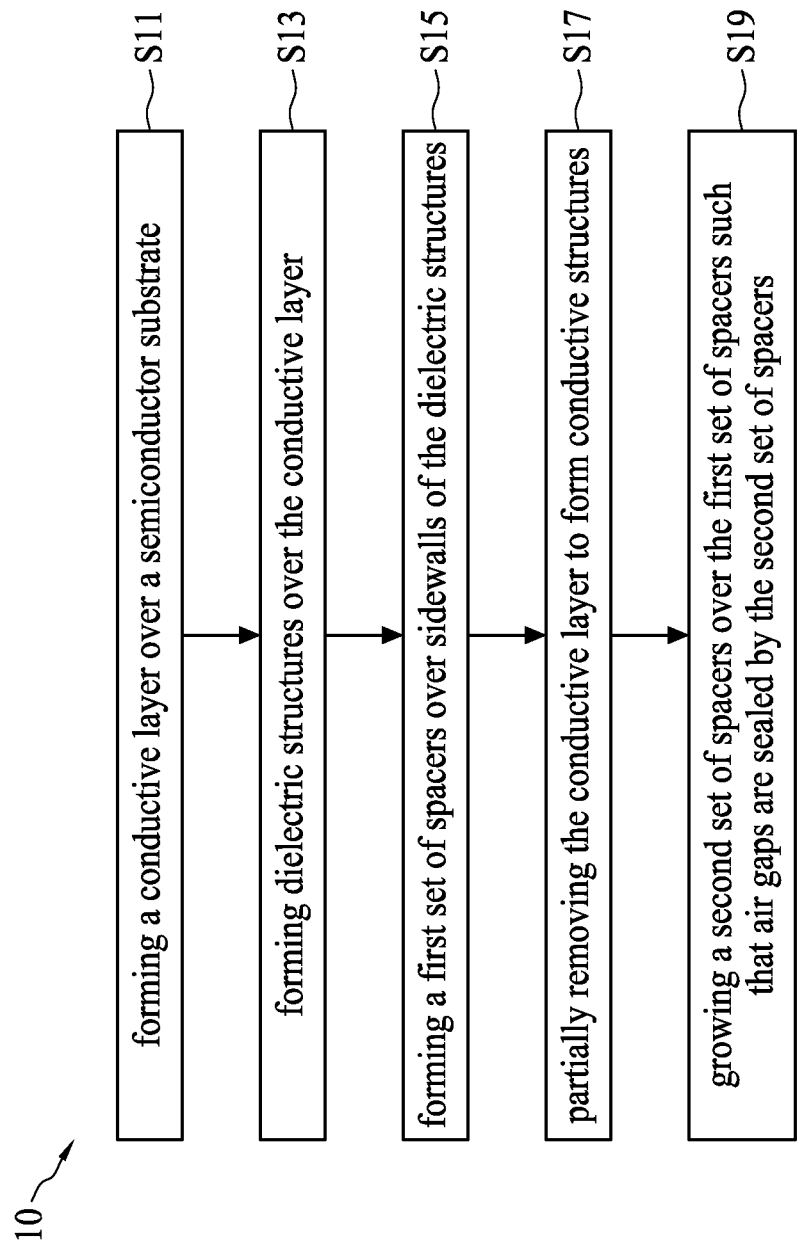
FIG. 4 is a flow diagram illustrating a method of forming the semiconductor device structure, in accordance with some embodiments.

FIG. 4 is a flow diagram illustrating a method 10 of forming the semiconductor device structure 100a, and the method 10 includes steps S11, S13, S15, S17 and S19, in accordance with some embodiments. The steps S11 to S19 of FIG. 4 are elaborated in connection with FIGS. 1, 2 and 5 to 12.

Figure 5:
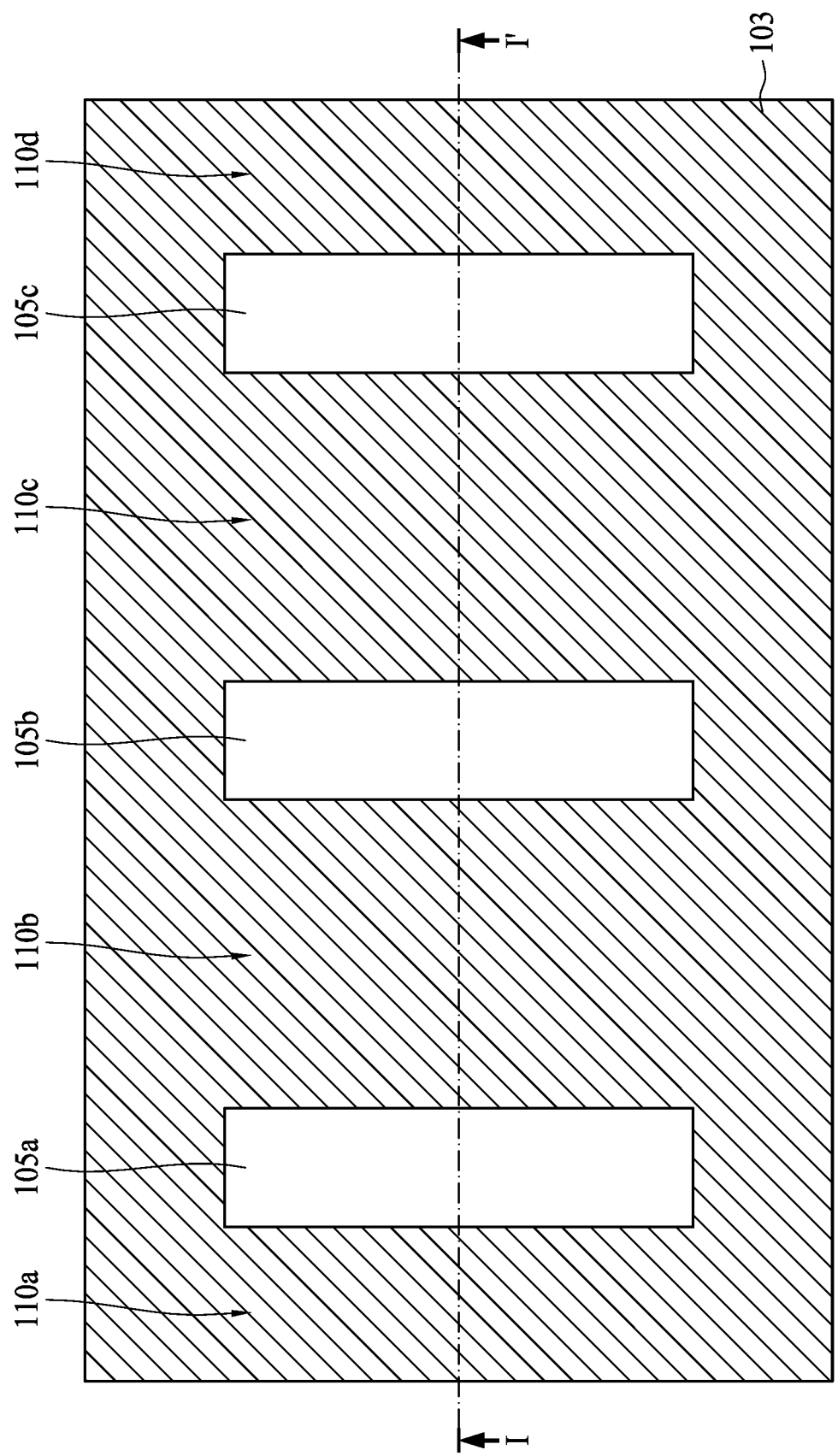
FIG. 5 is a top view illustrating one of the intermediate stages in the formation of a semiconductor device structure, in accordance with some embodiments.
Figure 6:
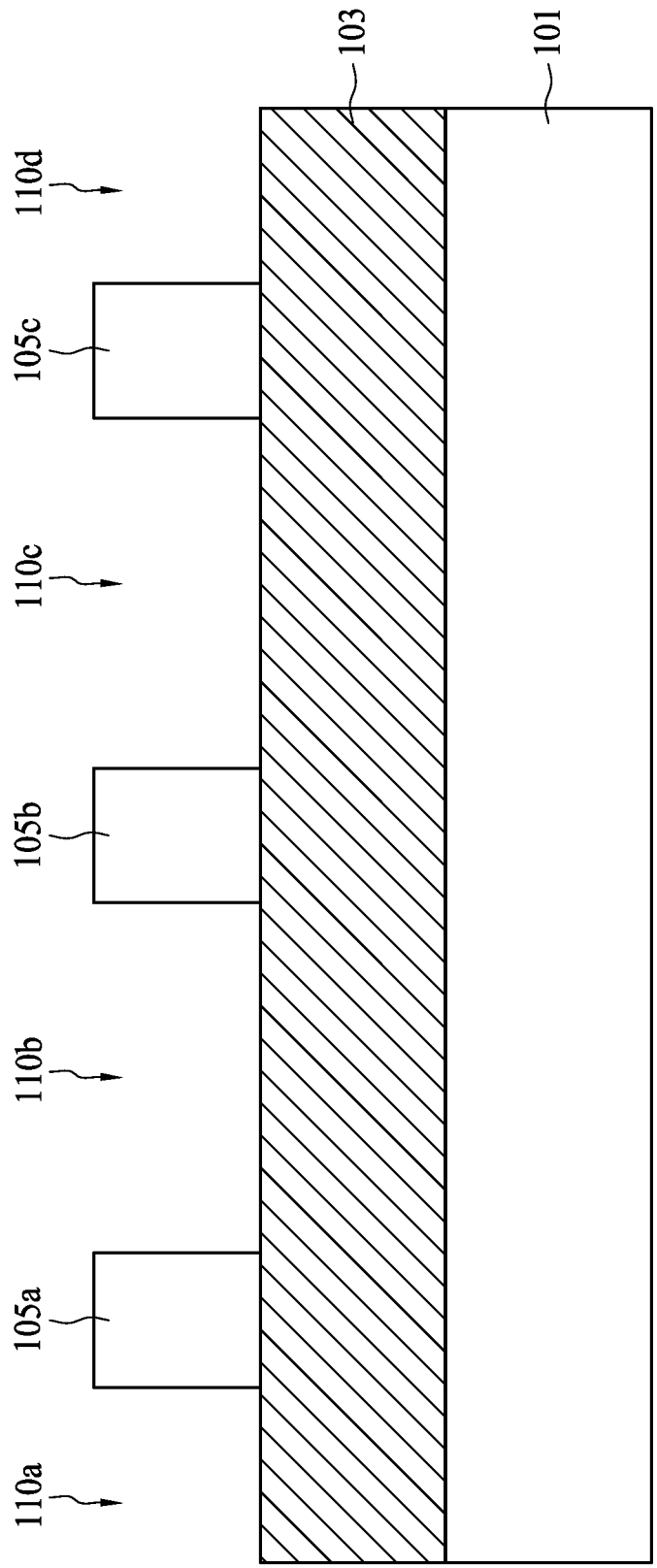
FIG. 6 is a cross-sectional view along a sectional line I-I' in FIG. 5, in accordance with some embodiments.

FIG. 5 is a top view illustrating one of the intermediate stages in the formation of the semiconductor device structure 100a, and FIG. 6 is a cross-sectional view along the sectional line I-I' in FIG. 5, in accordance with some embodiments.

As shown in FIGS. 5 and 6, the semiconductor substrate 101 is provided. The semiconductor substrate 101 may be a semiconductor wafer such as a silicon wafer. Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate, which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

Still referring to FIGS. 5 and 6, a conductive layer 103 is formed over the semiconductor substrate 101, in accordance with some embodiments. The respective step is illustrated as the step S11 in the method 10 shown in FIG. 4.

In some embodiments, the conductive layer 103 includes tungsten (W), aluminum (Al), copper (Cu), nickel (Ni), cobalt (Co), another conductive material, or a combination thereof. In some embodiments, the conductive layer 103 is formed by a deposition process. The deposition process may include an electroplating process, a chemical vapor deposition (CVD) process, a physical vapor deposition (PVD) process, a spin-coating process, an electroless plating process, or another applicable process.

It should be noted that, before the conductive layer 103 is formed, an isolation structure (not shown) may be formed in the semiconductor substrate 101 to define a plurality of active regions (not shown). In some embodiments, the conductive layer 103 is used to form bit lines of DRAM, the active regions include a plurality of source/drain (S/D) regions (not shown), and a plurality of bit line contacts (not shown) are formed in the S/D regions. The S/D regions may have a conductivity type different from that of the semiconductor substrate 101, and the bit line contacts may be disposed to electrically connect to the subsequently formed bit lines.

Next, the dielectric structures 105a, 105b and 105c are formed over the conductive layer 103, as shown in FIGS. 5 and 6 in accordance with some embodiments. The respective step is illustrated as the step S13 in the method 10 shown in FIG. 4. In some embodiments, the dielectric structures 105a, 105b and 105c are linear structures which extend along the same direction, and openings 110a, 110b, 110c and 110d are defined by the dielectric structures 105a, 105b and 105c.

In some embodiments, the dielectric structures 105a, 105b and 105c are formed by a deposition process and a subsequent etching process. The deposition process may include a CVD process, a PVD process, a spin-on process, another applicable process, or a combination thereof. The etching process may include a dry etching process or a wet etching process using a patterned mask.

Figure 7:
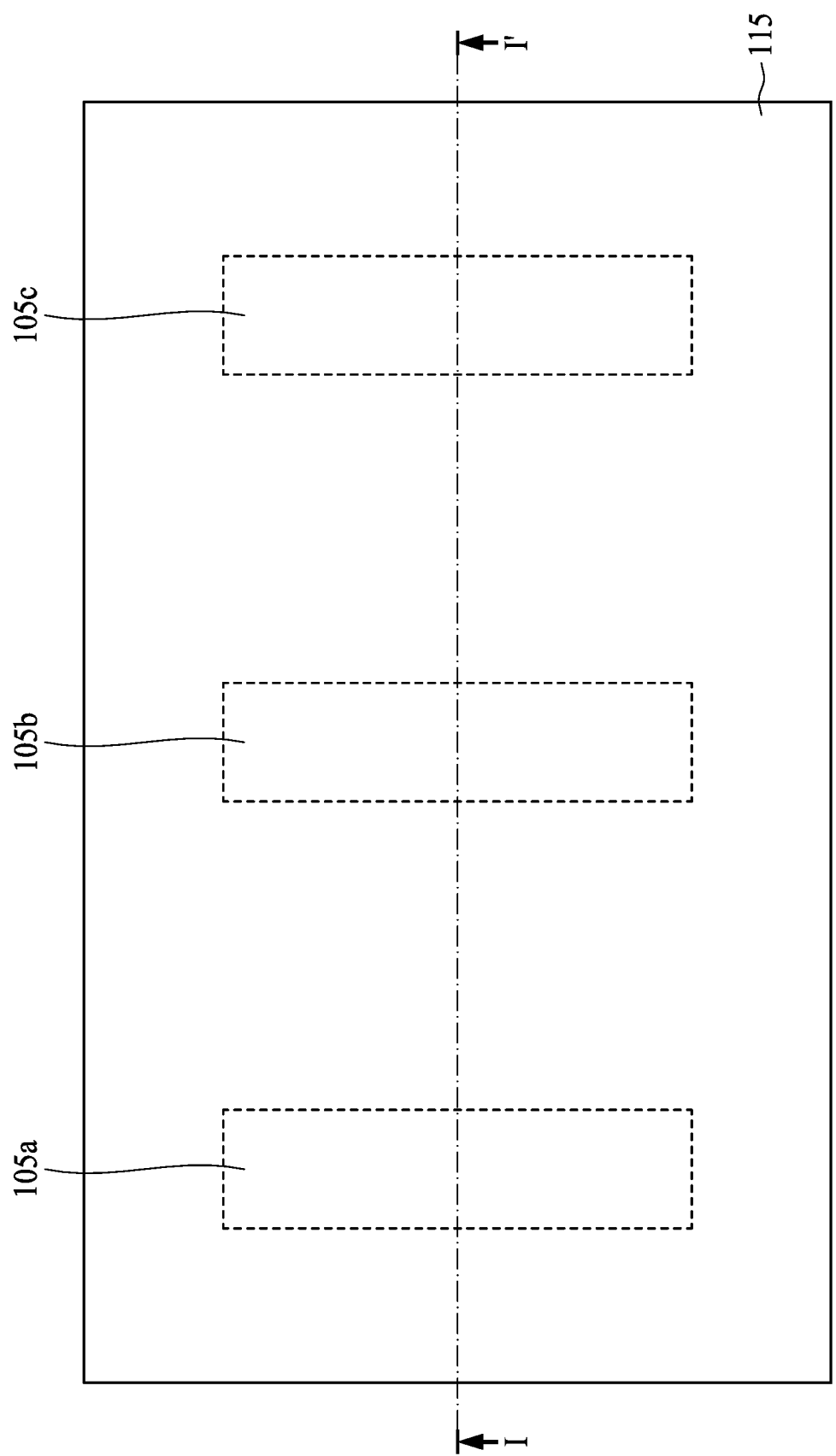
FIG. 7 is a top view illustrating one of the intermediate stages in the formation of a semiconductor device structure, in accordance with some embodiments.
Figure 8:
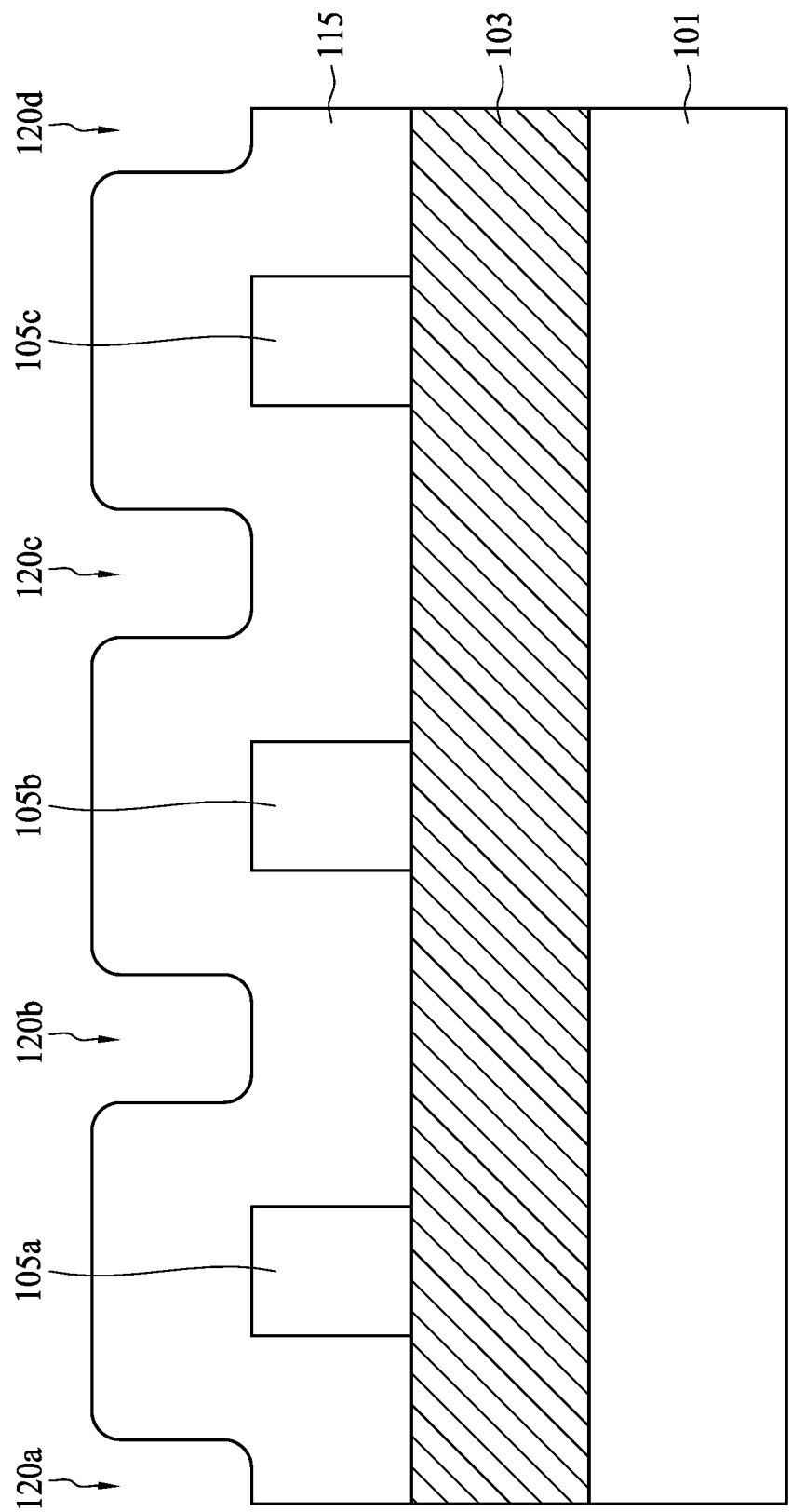
FIG. 8 is a cross-sectional view along a sectional line I-I' in FIG. 7, in accordance with some embodiments.

FIG. 7 is a top view illustrating one of the intermediate stages in the formation of the semiconductor device structure 100a, and FIG. 8 is a cross-sectional view along the sectional line I-I' in FIG. 7, in accordance with some embodiments.

After the dielectric structures 105a to 105c are formed, a spacer layer 115 is conformally deposited over the conductive layer 103 and the dielectric structures 105a to 105c, as shown in FIGS. 7 and 8 in accordance with some embodiments. In some embodiments, the spacer layer 115 fills the openings 110a, 110b, 110c and 110d (referring to FIGS. 5 and 6), and covers the sidewalls of the dielectric structures 105a to 105c and the top surface of the conductive layer 103 exposed by the openings 110a to 110d. Moreover, the spacer layer 115 extends to cover the top surfaces of the dielectric structures 105a to 105c, leaving recesses 120a, 120b, 120c and 120d, in accordance with some embodiments.

In some embodiments, the spacer layer 115 includes metal, such as cobalt (Co), nickel (Ni), tantalum (Ta), manganese (Mn), or poly-crystalline silicon, another applicable material, or a combination thereof. In some embodiments, the spacer layer 115 is formed by a deposition process. The deposition process may include an electroplating process, a CVD process, a PVD process, a spin-coating process, an electroless plating process, or another applicable process.

Figure 9:
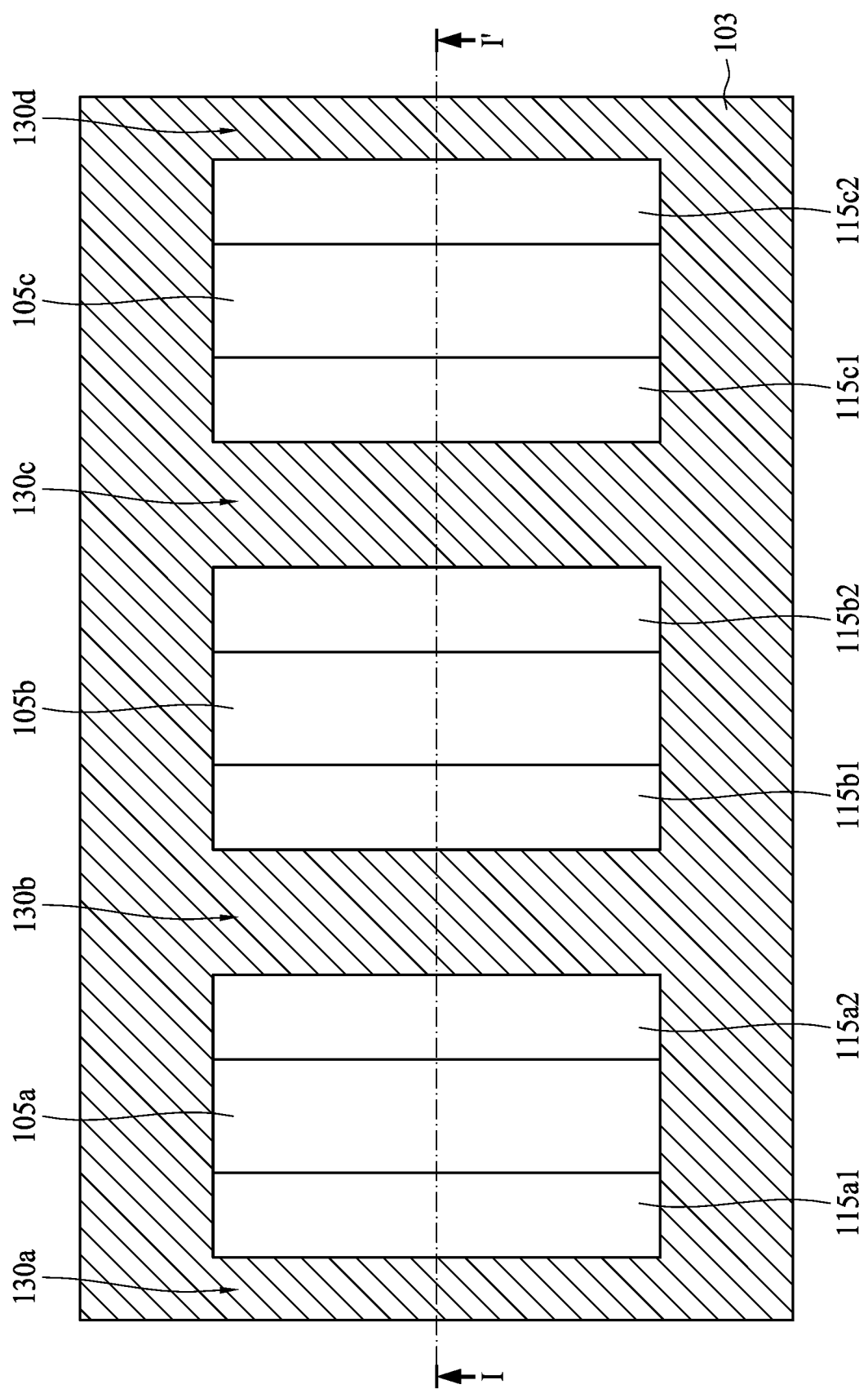
FIG. 9 is a top view illustrating one of the intermediate stages in the formation of a semiconductor device structure, in accordance with some embodiments.
Figure 10:
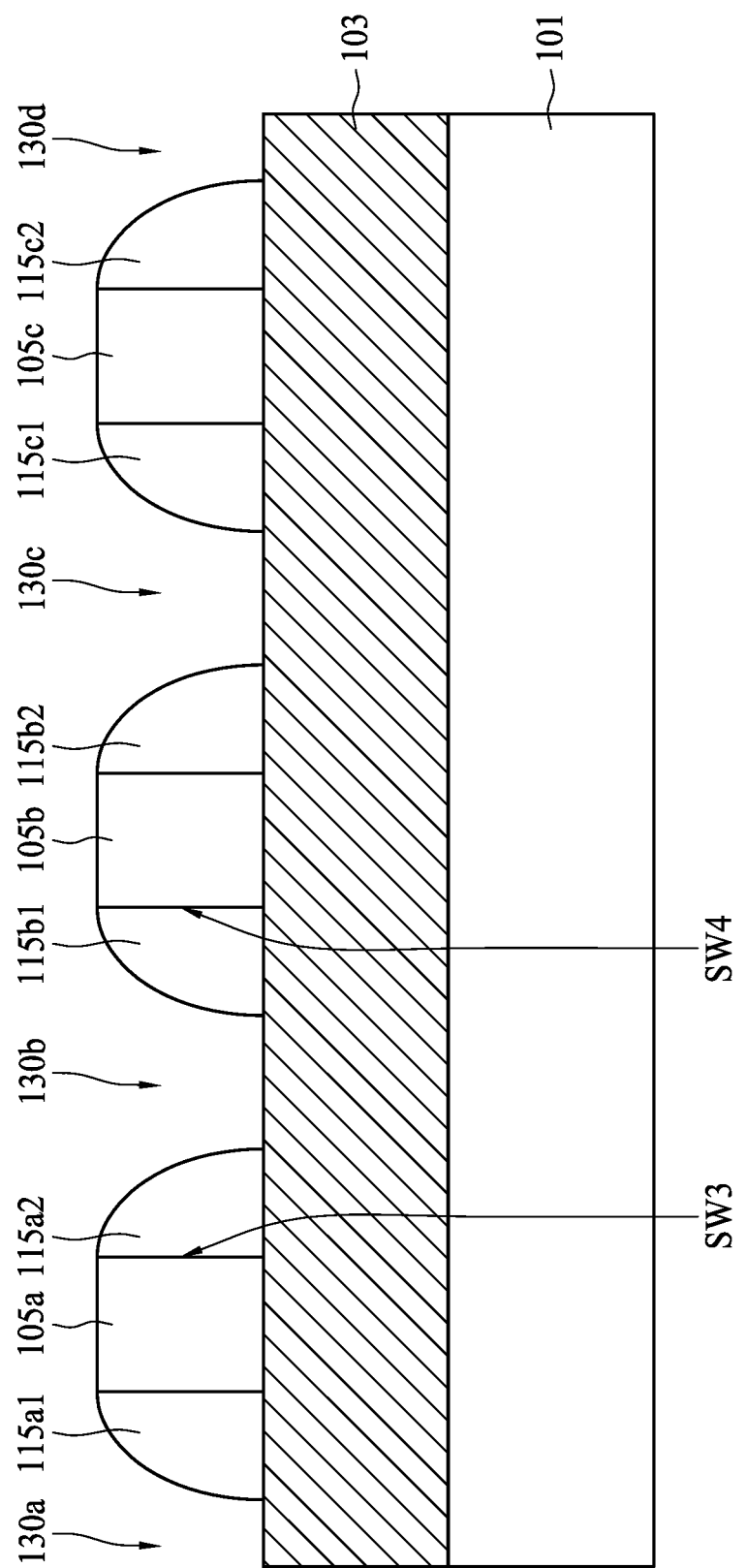
FIG. 10 is a cross-sectional view along a sectional line I-I' in FIG. 9, in accordance with some embodiments.

FIG. 9 is a top view illustrating one of the intermediate stages in the formation of the semiconductor device structure 100a, and FIG. 10 is a cross-sectional view along the sectional line I-I' in FIG. 9, in accordance with some embodiments.

After the spacer layer 115 is formed, the first set of spacers including the spacers 115a1, 115a2, 115b1, 115b2, 115c1 and 115c2 are formed over the sidewalls of the dielectric structures 105a to 105c by partially removing the spacer layer 115, as shown in FIGS. 9 and 10 in accordance with some embodiments. The respective step is illustrated as the step S15 in the method 10 shown in FIG. 4. In addition, openings 130a, 130b, 130c and 130d are defined by the spacers 115a1, 115a2, 115b1, 115b2, 115c1 and 115c2 and the dielectric structures 105a to 105c, in accordance with some embodiments.

More specifically, the spacer layer 115 is partially removed by performing an etching process, and the top surface of the semiconductor substrate 101 is partially exposed by the openings 130a to 130d after the etching process is performed. In some embodiments, the etching process is an anisotropic etching process, which removes a similar vertical amount (depth) of the spacer layer 115 in all places, leaving the spacers 115a1, 115a2, 115b1, 115b2, 115c1 and 115c2 along the sidewalls of the dielectric structures 105a to 105c. In some embodiments, the etching process includes a dry etching process, a wet etching process, or a combination thereof.

Figure 11:
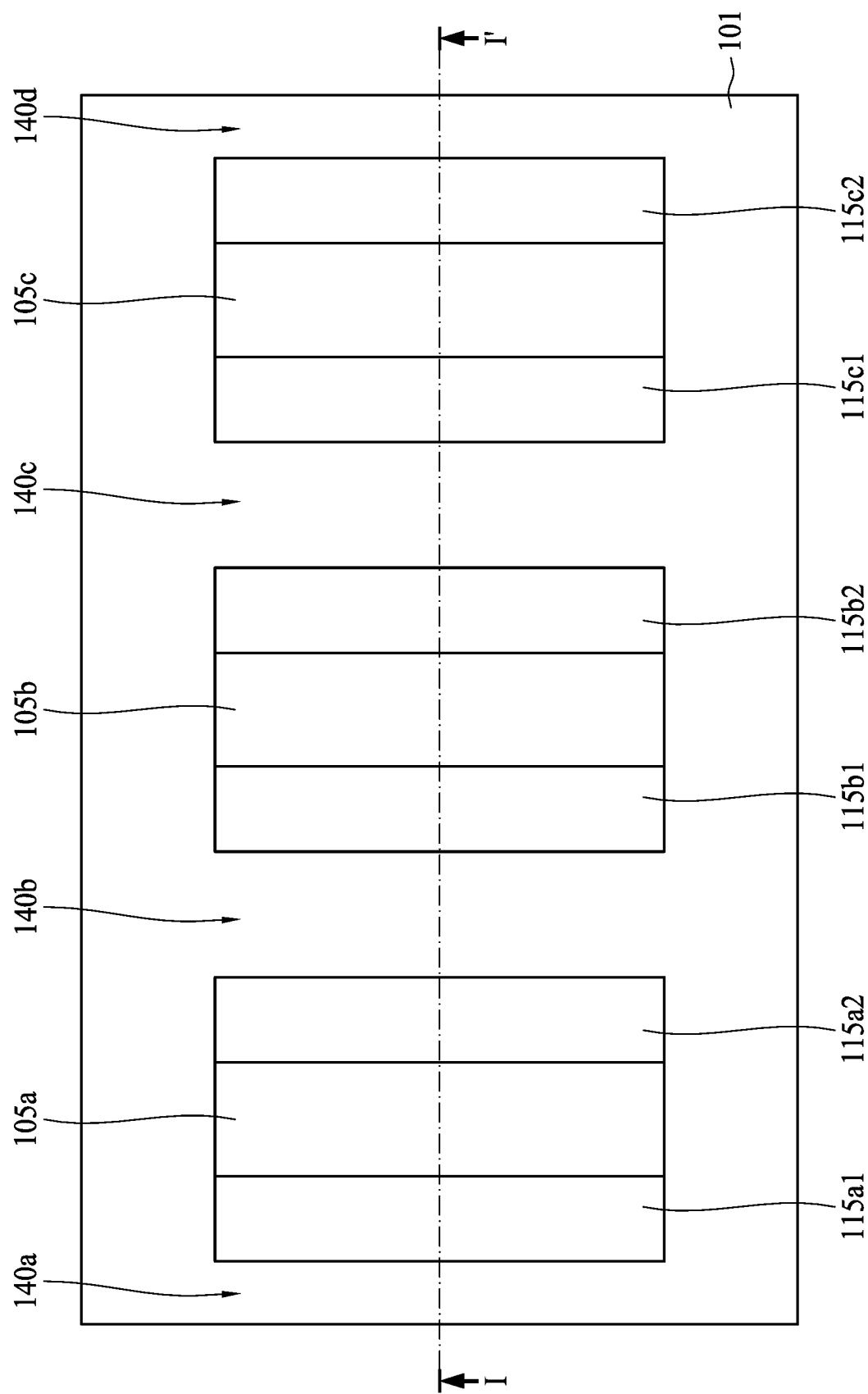
FIG. 11 is a top view illustrating one of the intermediate stages in the formation of a semiconductor device structure, in accordance with some embodiments.
Figure 12:
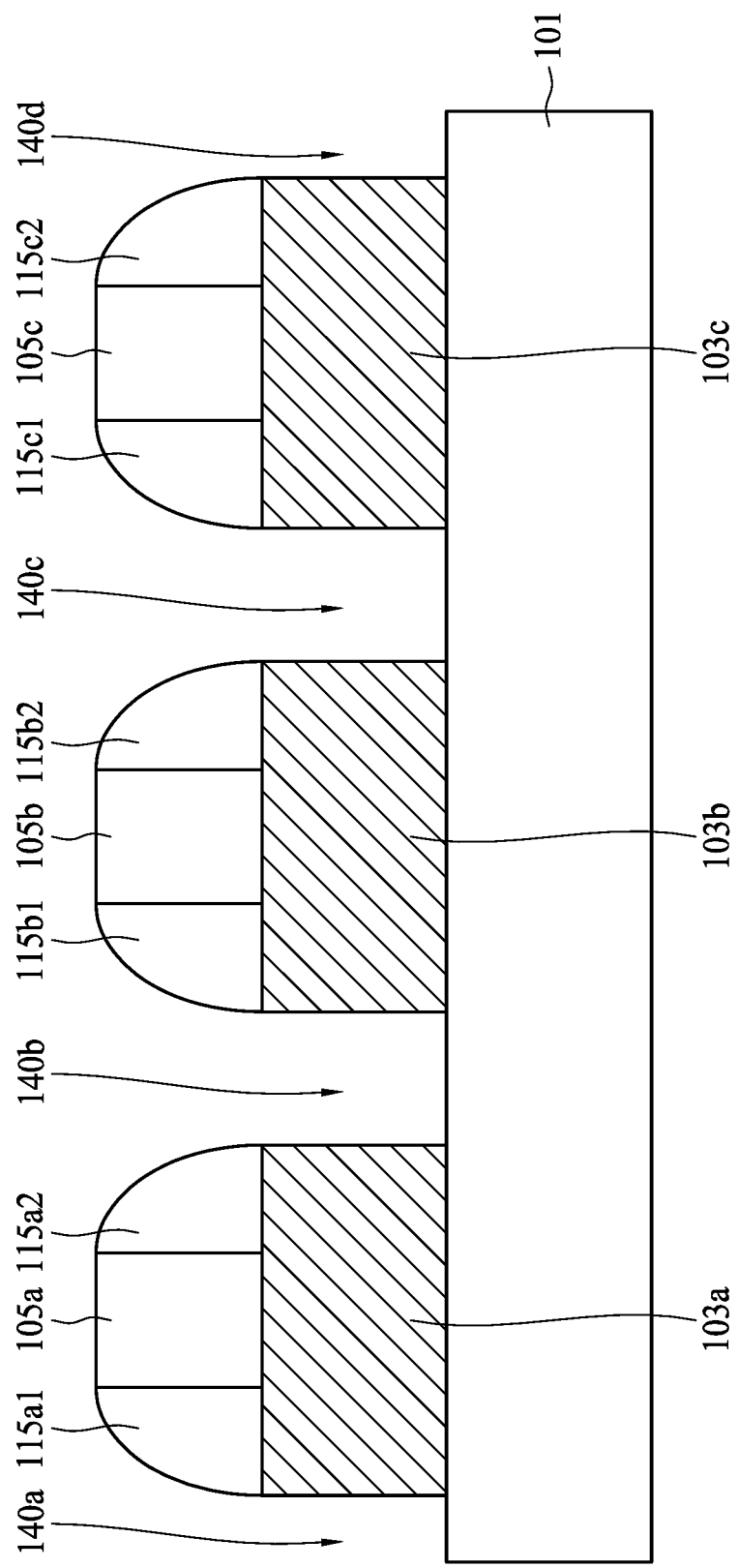
FIG. 12 is a cross-sectional view along a sectional line I-I in FIG. 11, in accordance with some embodiments.

FIG. 11 is a top view illustrating one of the intermediate stages in the formation of the semiconductor device structure 100a, and FIG. 12 is a cross-sectional view along the sectional line I-I' in FIG. 11, in accordance with some embodiments.

After the first set of spacers are formed, the conductive layer 103 is partially removed by an etching process to form the conductive structures 103a, 103b and 103c, as shown in FIGS. 11 and 12 in accordance with some embodiments. The respective step is illustrated as the step S17 in the method 10 shown in FIG. 4. In some embodiments, openings 140a, 140b, 140c and 140d under the openings 130a to 130d are obtained after the etching process is performed.

More specifically, the etching process for forming the conductive structures 103a to 103c is performed using the dielectric structures 105a to 105c and the first set of spacers (including the spacers 115a1, 115a2, 115b1, 115b2, 115c1 and 115c2) as a mask. In other words, portions of the conductive layer 103 exposed by the openings 130a to 130d (referring to FIGS. 9 and 10) are removed by the etching process, and the top surface of the semiconductor substrate 101 is partially exposed by the openings 140a to 140d, in accordance with some embodiments. In addition, in some embodiments, the etching process includes a dry etching process, a wet etching process, or a combination thereof.

After the conductive structures 103a to 103c are formed, the second set of spacers including the spacers 145a1, 145a2, 145b1, 145b2, 145c1 and 145c2 are grown over the first set of spacers, and the air gaps 150a, 150b, 150c and 150d are covered (i.e., sealed) by the second set of spacers, as shown in FIGS. 1 to 3 in accordance with some embodiments. The respective step is illustrated as the step S19 in the method 10 shown in FIG. 4.

In some embodiments, the spacers 145a1, 145a2, 145b1, 145b2, 145c1 and 145c2 include metal nitride, such as aluminum nitride, metal silicide, graphene, another applicable material, or a combination thereof. It should be noted that the second set of spacers (e.g., the spacers 145a1, 145a2, 145b1, 145b2, 145c1 and 145c2) are formed using the first set of spacers (e.g., the spacers 115a1, 115a2, 115b1, 115b2, 115c1 and 115c2) as catalyst structures, and the second set of spacers are grown until the lower portions of the adjacent second set of spacers are physically connected. For example, the lower portion 145a2' of the spacer 145a2 and the lower portion 145b1' of the spacer 145b1 are physically connected.

After the second set of spacers are formed, adjacent conductive structures 103a to 103c are separated from each other by the air gaps 150a to 150d, and the semiconductor device structure 100a is obtained. Moreover, the second set of spacers are separated from the semiconductor substrate 101 by the air gaps 150a to 150d. In some embodiments, the semiconductor device structure 100a is a DRAM, and the conductive structures 103a to 103c are bit lines (BL).

The semiconductor device structure 100a includes conductive structures 103a to 103c, the first set of spacers (e.g., the spacers 115a1, 115a2, 115b1, 115b2, 115c1 and 115c2) over the conductive structures 103a to 103c, and the second set of spacers (e.g., the spacers 145a1, 145a2, 145b1, 145b2, 145c1 and 145c2) over the first set of spacers. Since the air gaps 150a to 150d are formed between adjacent conductive structures 103a to 103c and are sealed by the lower portions (e.g., the lower portions 145a2' and 145b1') of the second set of spacers, the capacitance between adjacent conductive structures may be reduced. As a result, the operation speeds of the semiconductor device structure 100a may be increased, and the overall device performance may be improved.

Figure 13:
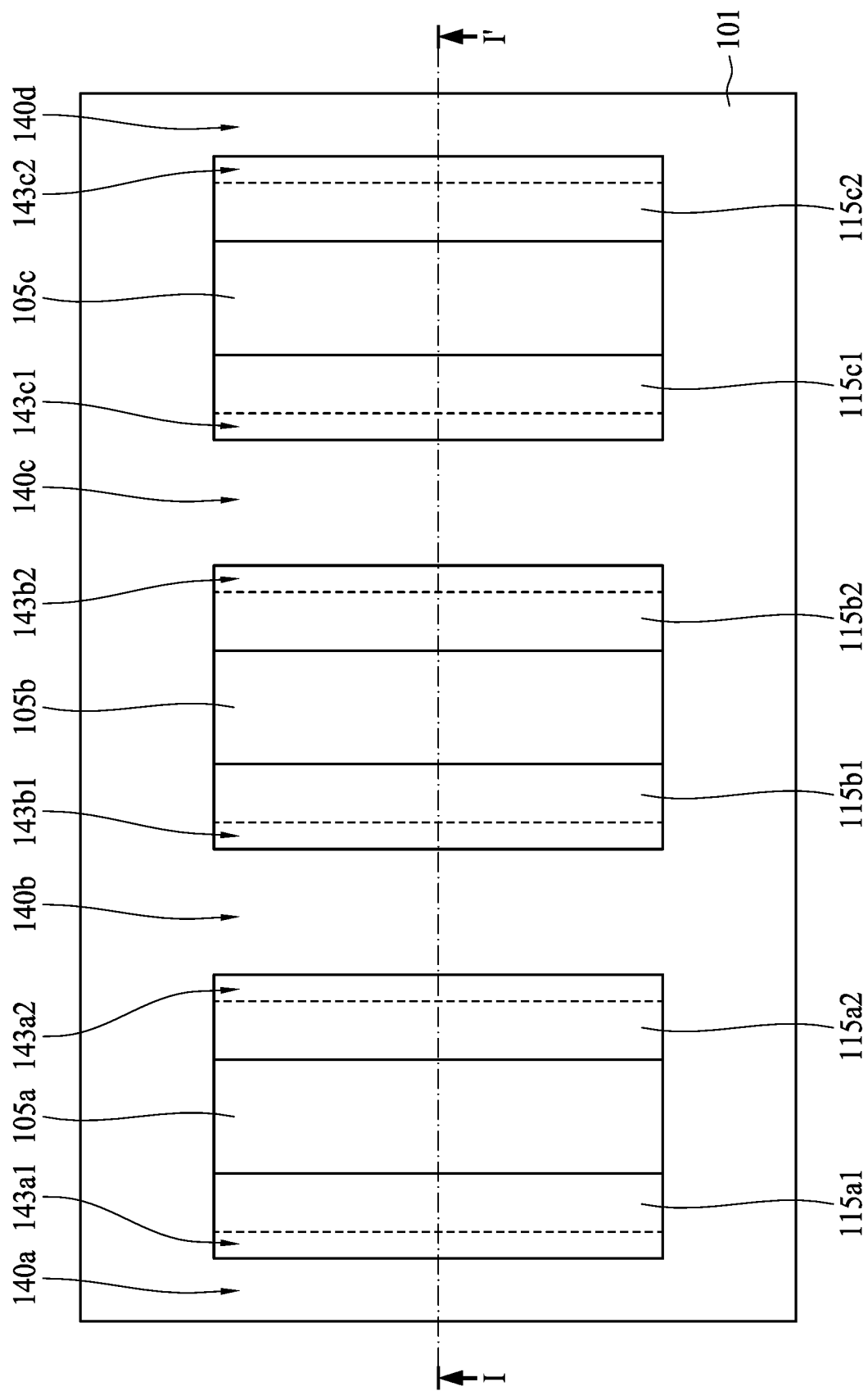
FIG. 13 is a top view illustrating one of the intermediate stages in the formation of a semiconductor device structure, in accordance with some embodiments.
Figure 14:
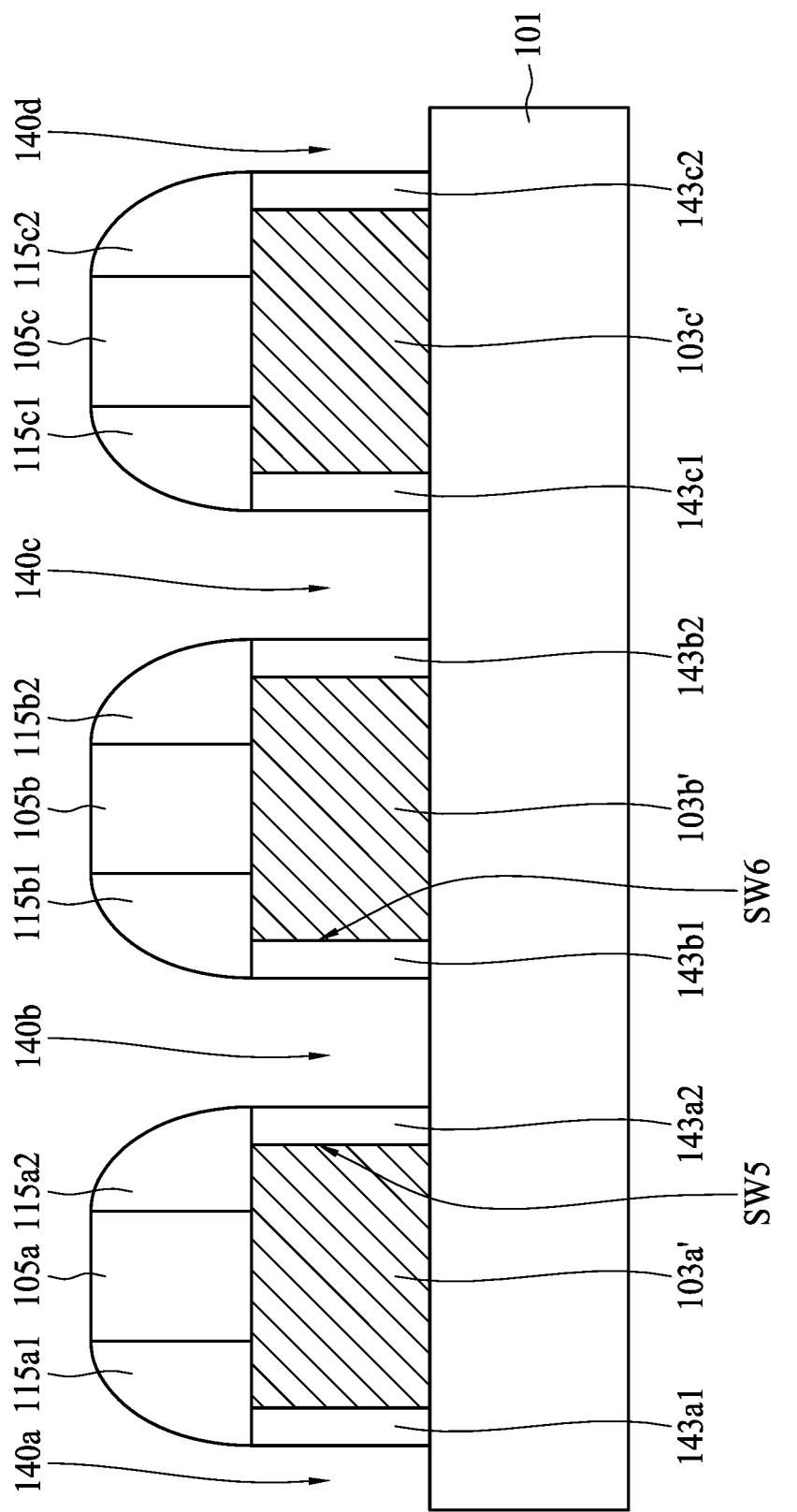
FIG. 14 is a cross-sectional view along a sectional line I-I' in FIG. 13, in accordance with some embodiments.
Figure 15:
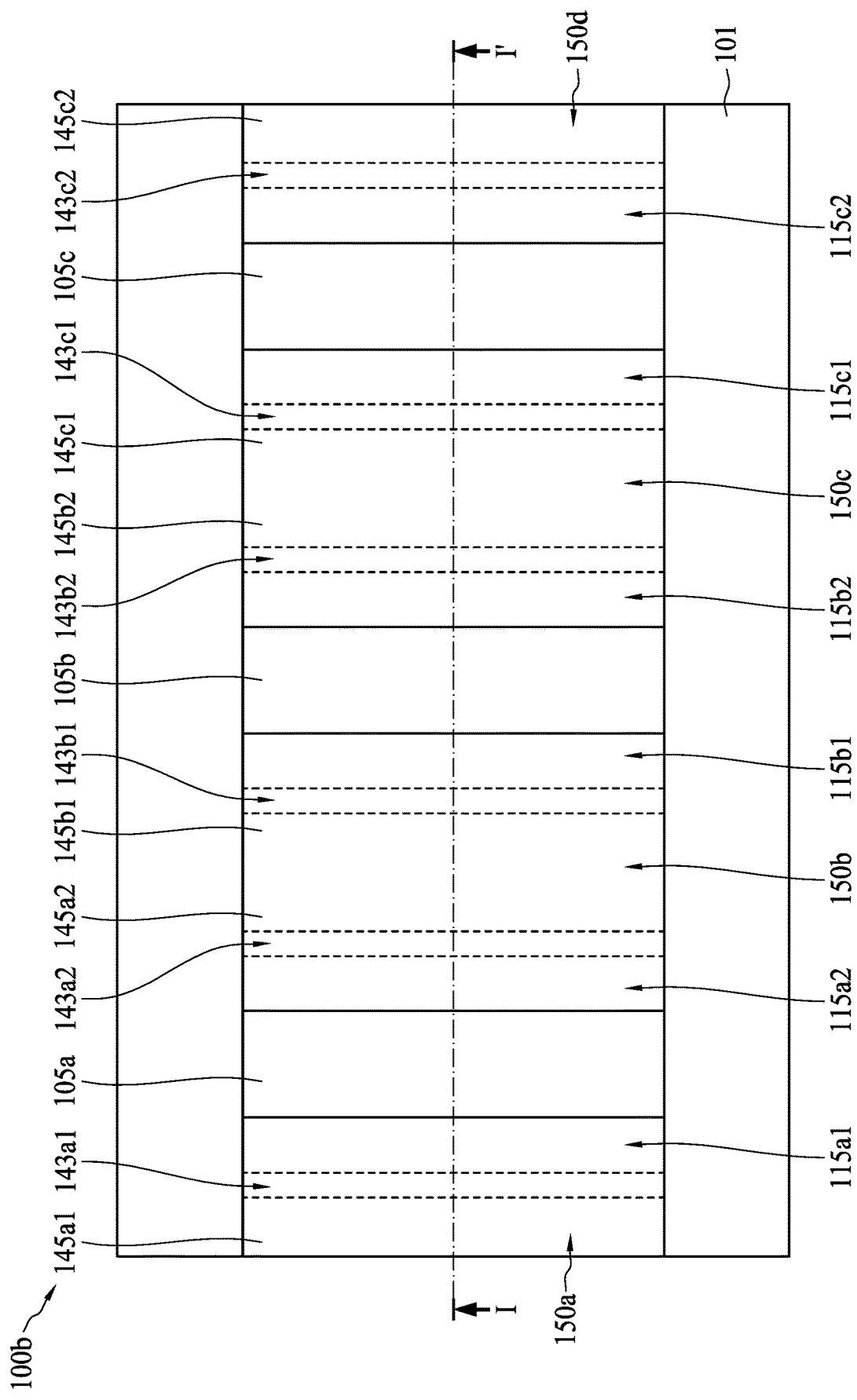
FIG. 15 is a top view illustrating one of the intermediate stages in the formation of a semiconductor device structure, in accordance with some embodiments.
Figure 16:
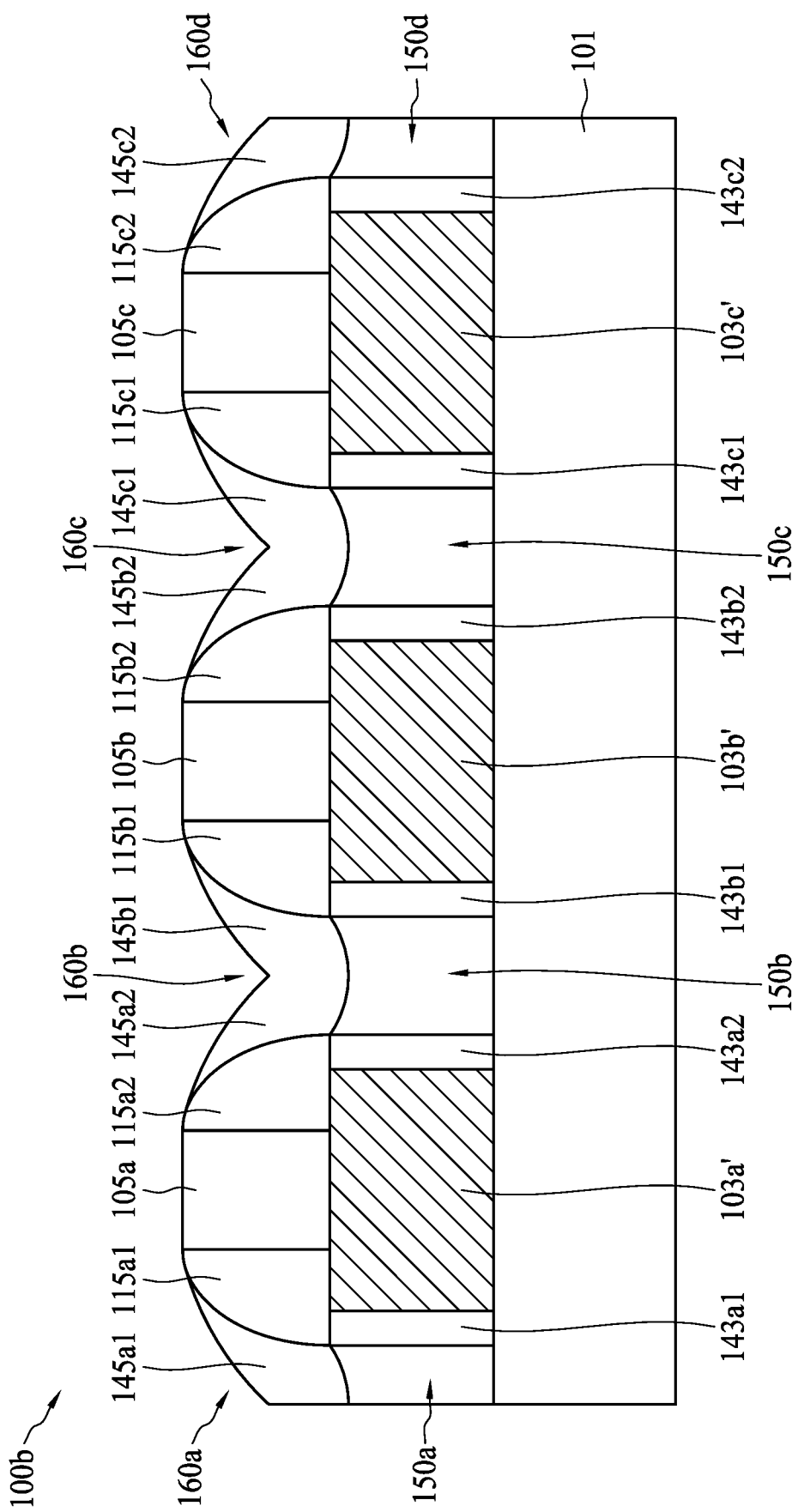
FIG. 16 is a cross-sectional view along a sectional line I-I' in FIG. 15, in accordance with some embodiments.

FIGS. 13 and 15 are top views illustrating the intermediate stages in the formation of a semiconductor device structure 100b, FIG. 14 is a cross-sectional view along the sectional line I-I' in FIG. 13, and FIG. 16 is a cross-sectional view along the sectional line I-I' in FIG. 15, in accordance with some embodiments.

Some processes and materials used to form the semiconductor device structure 100b are similar to, or the same as, those used to form the semiconductor device structure 100a, and detailed descriptions thereof are not repeated herein. The difference between the second embodiment shown in FIGS. 13 to 16 and the first embodiment shown in FIGS. 1 to 3 and 5 to 12 is that, in the second embodiment, the sidewall portions of the conductive structures 103a to 103c are transformed into dielectric layers 143a1, 143a2, 143b1, 143b2, 143c1 and 143c2 before the air gaps 150a to 150d are sealed by the second set of spacers (e.g., the spacers 145a1, 145a2, 145b1, 145b2, 145c1 and 145c2). As a result, the dielectric layers 143a1 and 143a2 are formed over opposite sidewalls of the remaining conductive structure 103a', the dielectric layers 143b1 and 143b2 are formed over opposite sidewalls of the remaining conductive structure 103b', and the dielectric layers 143c1 and 143c2 are formed over opposite sidewalls of the remaining conductive structure 103c'. For example, the sidewall SW5 of the remaining conductive structure 103a' is covered by the dielectric layer 143a2, and the sidewall SW6 of the remaining conductive structure 103b' is covered by the dielectric layer 143b1.

In some embodiments, the dielectric layers 143a1, 143a2, 143b1, 143b2, 143c1 and 143c2 are at least partially covered by the first set of spacers (e.g., the spacers 115a1, 115a2, 115b1, 115b2, 115c1 and 115c2). Moreover, in some embodiments, the dielectric layers 143a1, 143a2, 143b1, 143b2, 143c1 and 143c2 are formed by performing a heat treatment process, which includes an oxidation process, a nitridation process, another suitable process or a combination thereof, and the dielectric layers 143a1, 143a2, 143b1, 143b2, 143c1 and 143c2 include tungsten oxide, aluminum oxide, copper oxide, another metal oxide or metal nitride, or a combination thereof.

After the dielectric layers 143a1, 143a2, 143b1, 143b2, 143c1 and 143c2 are formed, the second set of spacers including the spacers 145a1, 145a2, 145b1, 145b2, 145c1 and 145c2 are grown over the first set of spacers including the spacers 115a1, 115a2, 115b1, 115b2, 115c1 and 115c2, and the air gaps 150a, 150b, 150c and 150d are covered (i.e., sealed) by the second set of spacers, as shown in FIGS. 15 and 16 in accordance with some embodiments.

After the second set of spacers are formed, adjacent remaining conductive structures 103a' to 103c' are separated from each other by the air gaps 150a to 150d and the dielectric layers 143a1, 143a2, 143b1, 143b2, 143c1 and 143c2, and the semiconductor device structure 100b is obtained.

Figure 17:
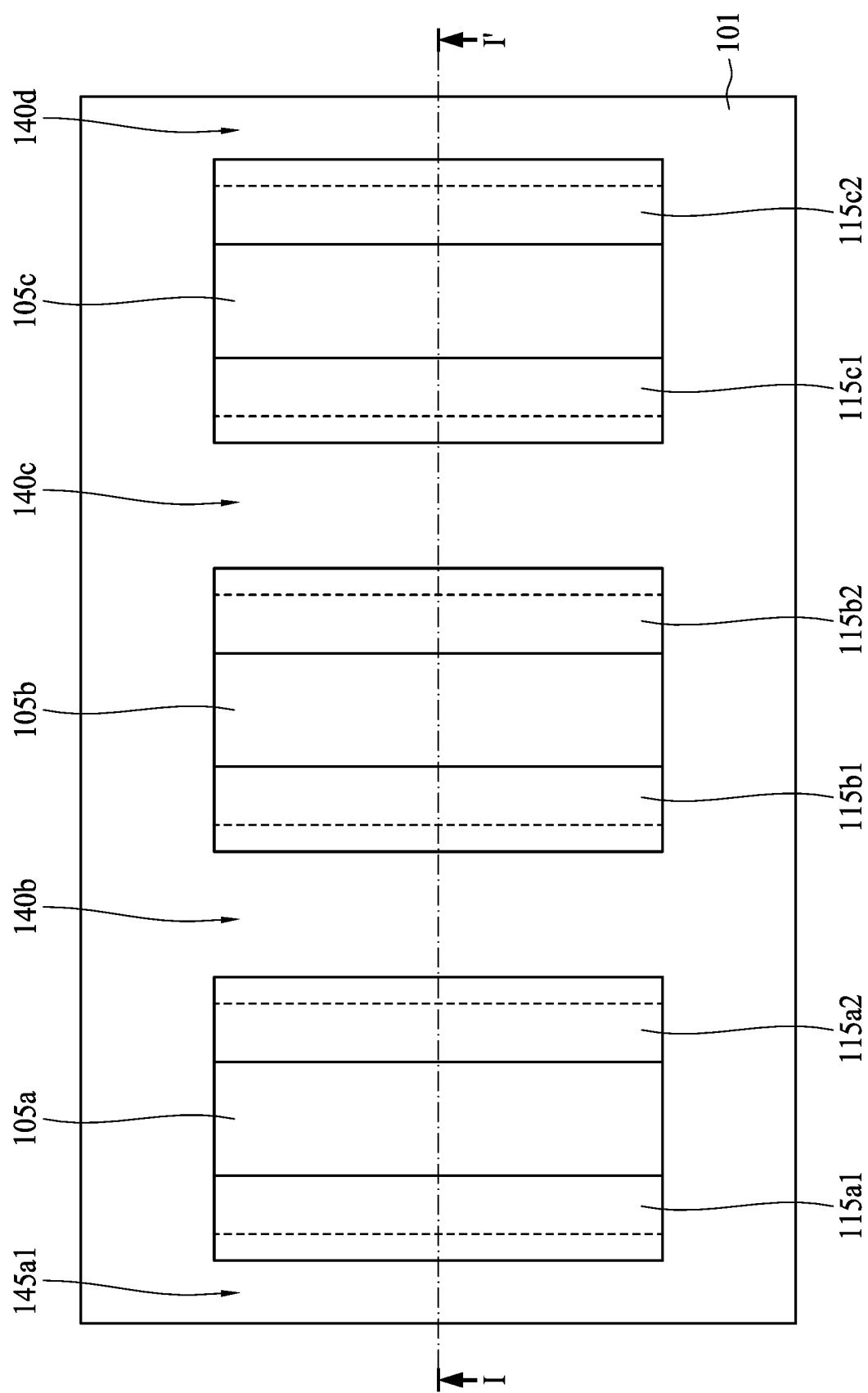
FIG. 17 is a top view illustrating one of the intermediate stages in the formation of a semiconductor device structure, in accordance with some embodiments.
Figure 18:
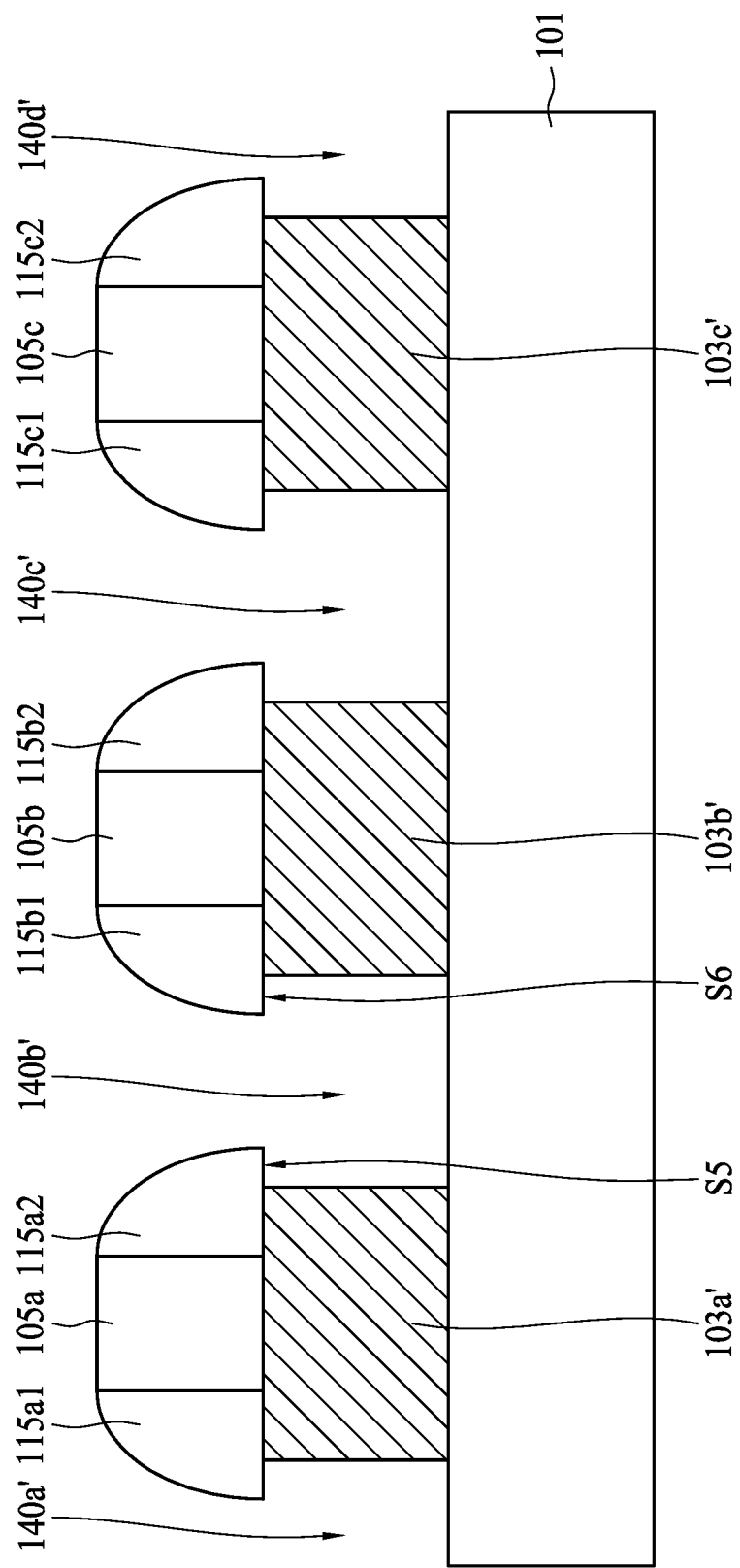
FIG. 18 is a cross-sectional view along a sectional line I-I' in FIG. 17, in accordance with some embodiments.
Figure 19:
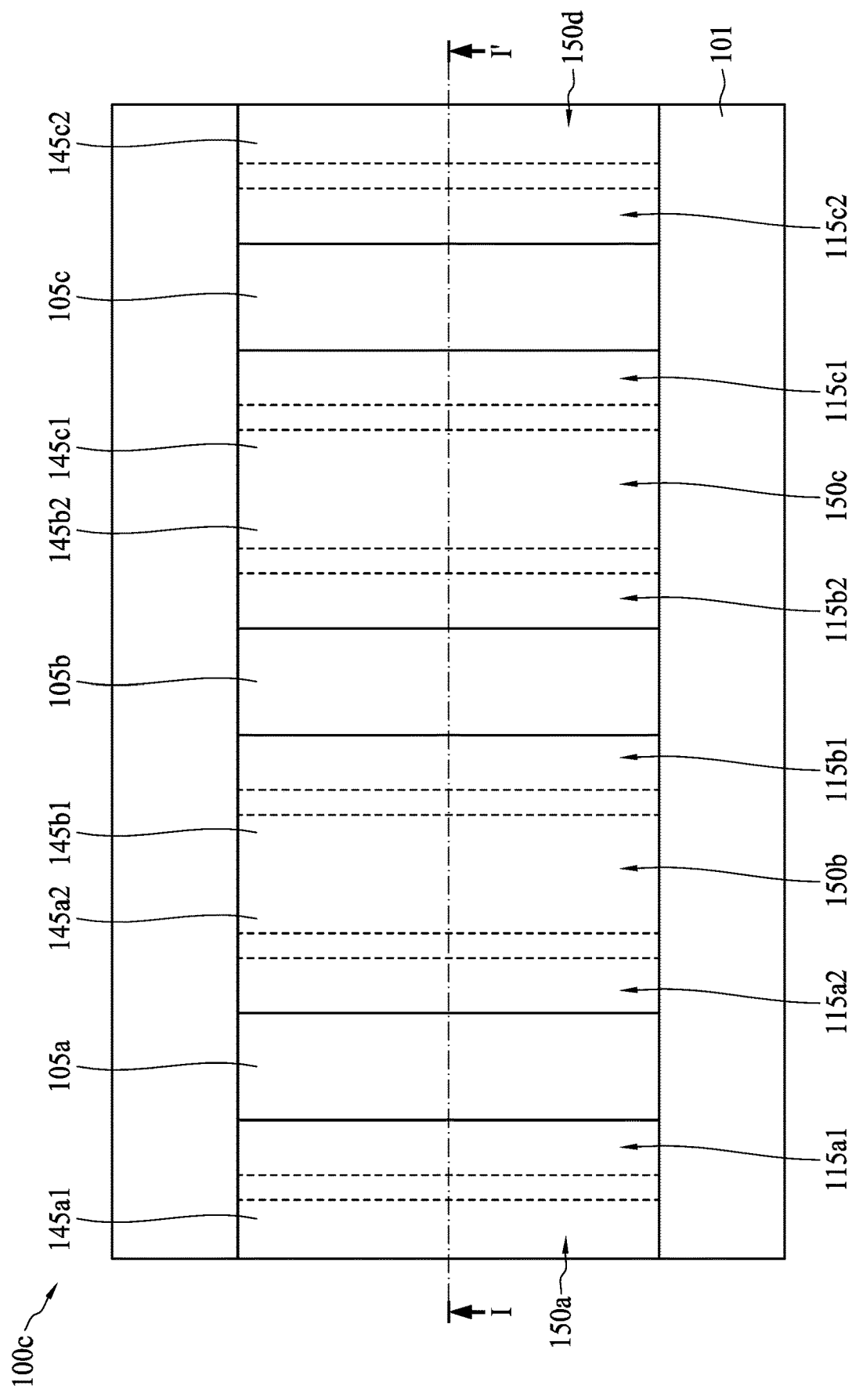
FIG. 19 is a top view illustrating one of the intermediate stages in the formation of a semiconductor device structure, in accordance with some embodiments.
Figure 20:
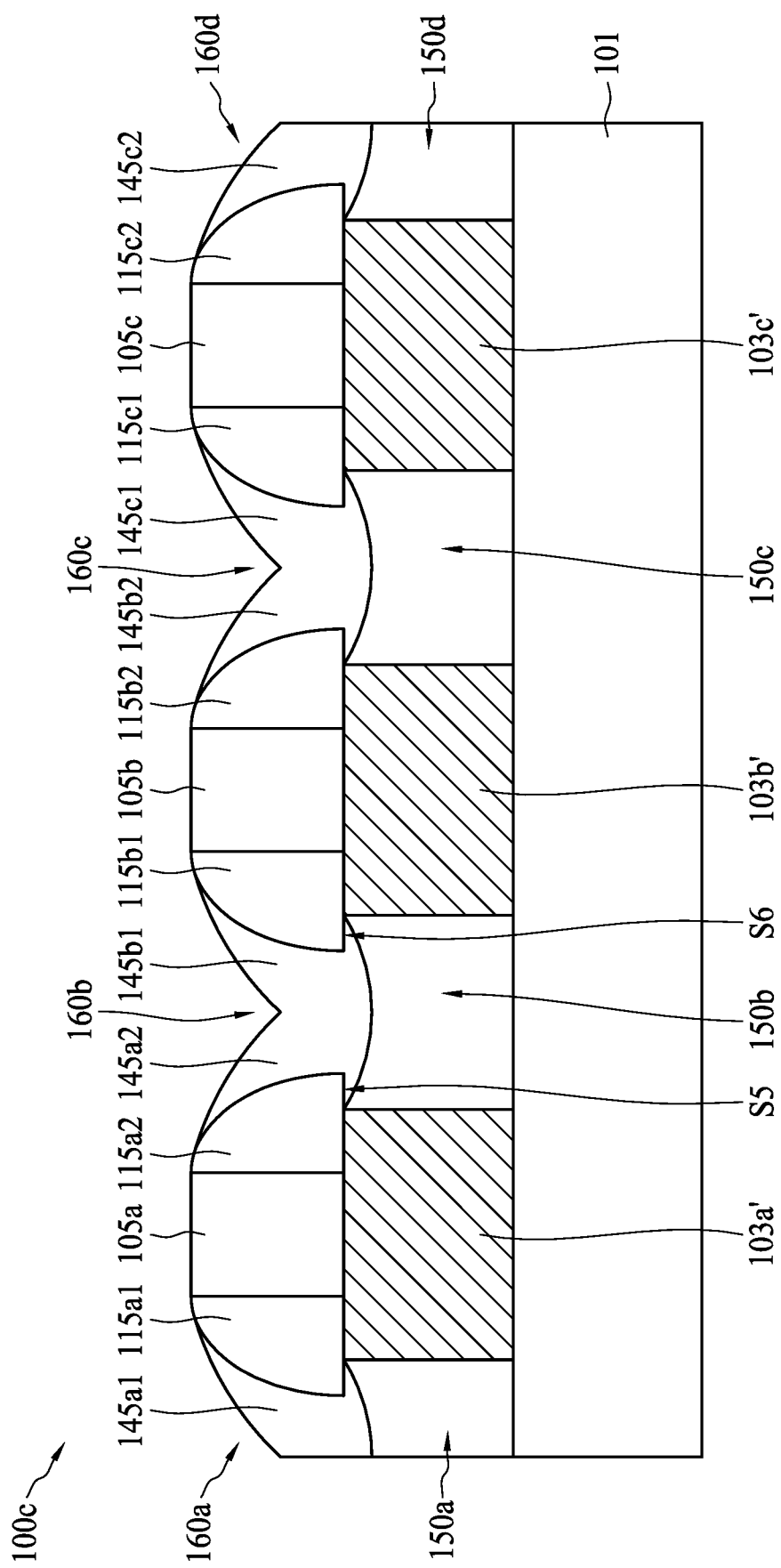
FIG. 20 is a cross-sectional view along a sectional line I-I' in FIG. 19, in accordance with some embodiments.

FIGS. 17 and 19 are top views illustrating the intermediate stages in the formation of a semiconductor device structure 100c, FIG. 18 is a cross-sectional view along the sectional line I-I' in FIG. 17, and FIG. 20 is a cross-sectional view along the sectional line I-I' in FIG. 19, in accordance with some embodiments.

Some processes and materials used to form the semiconductor device structure 100c are similar to, or the same as, those used to form the semiconductor device structure 100b, and detailed descriptions thereof are not repeated herein. The difference between the third embodiment in FIGS. 17 to 20 and the second embodiment in FIGS. 13 to 16 is that, in the third embodiment, the dielectric layers 143a1, 143a2, 143b1, 143b2, 143c1 and 143c2 are removed before the air gaps 150a to 150d are sealed by the second set of spacers (e.g., the spacers 145a1, 145a2, 145b1, 145b2, 145c1 and 145c2). As a result, the air gaps 150a to 150d of the semiconductor device structure 100c are wider than the air gaps 150a to 150d of the semiconductor device structures 100a and 100b.

In some embodiments, the dielectric layers 143a1, 143a2, 143b1, 143b2, 143c1 and 143c2 are removed by an etching process, and the etching process includes a dry etching process, a wet etching process, or a combination thereof. After the etching process is performed, the bottom surfaces of the first set of spacers (e.g., the spacers 115a1, 115a2, 115b1, 115b2, 115c1 and 115c2) are partially exposed, and the openings 140a, 140b, 140c and 140d are widened into openings 140a', 140b', 140c' and 140d'. For example, the bottom surface S5 of the spacer 115a2 and the bottom surface S6 of the spacer 115b1 are partially exposed by the opening 140b', as shown in FIG. 18 in accordance with some embodiments.

After the dielectric layers 143a1, 143a2, 143b1, 143b2, 143c1 and 143c2 are removed, the second set of spacers including the spacers 145a1, 145a2, 145b1, 145b2, 145c1 and 145c2 are grown over the first set of spacers, and the air gaps 150a, 150b, 150c and 150d are covered (i.e., sealed) by the second set of spacers, as shown in FIGS. 19 and 20 in accordance with some embodiments.

It should be noted that, in some embodiments, the second set of spacers (e.g., the spacers 145a1, 145a2, 145b1, 145b2, 145c1 and 145c2) are grown over the bottom surfaces of the first set of spacers (e.g., the spacers 115a1, 115a2, 115b1, 115b2, 115c1 and 115c2) exposed by the openings 140a' to 140d'. That is, the bottom surfaces of the first set of spacers are covered by the second set of spacers, in accordance with some embodiments. After the second set of spacers are formed, adjacent remaining conductive structures 103a' to 103c' are separated from each other by the air gaps 150a to 150d, and the semiconductor device structure 100c is obtained.

Embodiments of semiconductor device structures and methods for forming the same are provided. Each of the semiconductor device structures 100a, 100b and 100c includes conductive structures 103a to 103c (or the remaining conductive structures 103a' to 103c'), the first set of spacers (e.g., the spacers 115a1, 115a2, 115b1, 115b2, 115c1 and 115c2) over the conductive structures 103a to 103c (or the remaining conductive structures 103a' to 103c'), and the second set of spacers (e.g., the spacers 145a1, 145a2, 145b1, 145b2, 145c1 and 145c2) over the first set of spacers. Since the air gaps 150a to 150d are formed between adjacent conductive structures 103a to 103c (or the remaining conductive structures 103a' to 103c') and are sealed by the lower portions (e.g., the lower portions 145a2' and 145b1') of the second set of spacers, the capacitance between adjacent conductive structures may be reduced. As a result, the operation speeds of the semiconductor device structures 100a, 100b and 100c may be increased, and the overall device performance may be improved.

In one embodiment of the present disclosure, a semiconductor device structure is provided. The semiconductor device structure includes a first conductive structure and a second conductive structure disposed over a semiconductor substrate. The semiconductor device structure also includes a first spacer disposed over the first conductive structure, and a second spacer disposed over the second conductive structure. The semiconductor device structure further includes a third spacer disposed over a sidewall of the first spacer, and a fourth spacer disposed over a sidewall of the second spacer. A lower portion of the third spacer adjoins a lower portion of the fourth spacer, and an air gap is covered by the lower portion of the third spacer and the lower portion of the fourth spacer.

In another embodiment of the present disclosure, a semiconductor device structure is provided. The semiconductor device structure includes a first conductive structure and a second conductive structure disposed over a semiconductor substrate. The first conductive structure and the second conductive structure are separated by an air gap. The semiconductor device structure also includes a first spacer disposed over a top surface of the first conductive structure, and a second spacer disposed over a top surface of the second conductive structure. The semiconductor device structure further includes a third spacer disposed over the first spacer. The third spacer is separated from the top surface of the first conductive structure by the first spacer. In addition, the semiconductor device structure includes a fourth spacer disposed over the second spacer. The fourth spacer is separated from the top surface of the second conductive structure by the second spacer, and the air gap is sealed by the third spacer and the fourth spacer.

In one embodiment of the present disclosure, a method for forming a semiconductor device structure is provided. The method includes forming a conductive layer over a semiconductor substrate, and forming a first dielectric structure and a second dielectric structure over the conductive layer. The method also includes forming a first spacer over a sidewall of the first dielectric structure and a second spacer over a sidewall of the second dielectric structure, and removing a portion of the conductive layer exposed by the first spacer and the second spacer to form a first conductive structure and a second conductive structure. The method further includes growing a third spacer over the first spacer and a fourth spacer over the second spacer such that an air gap is formed between the first conductive structure and the second conductive structure and sealed by the third spacer and the fourth spacer.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for forming a semiconductor device structure, comprising:
   forming a conductive layer over a semiconductor substrate;
   forming a first dielectric structure and a second dielectric structure over the conductive layer;

forming a first spacer over a sidewall of the first dielectric structure and a second spacer over a sidewall of the second dielectric structure;

removing a portion of the conductive layer exposed by the first spacer and the second spacer to form a first conductive structure and a second conductive structure; and growing a third spacer over the first spacer and a fourth spacer over the second spacer such that an air gap is formed between the first conductive structure and the second conductive structure and sealed by the third spacer and the fourth spacer.

2. The method for forming a semiconductor device structure of claim 1, wherein the step of forming the first spacer and the second spacer comprises:

conformally depositing a spacer layer over the conductive layer, the first dielectric structure and the second dielectric structure; and partially removing the spacer layer to expose the first dielectric structure and the second dielectric structure such that the first spacer is formed facing the second spacer.

3. The method for forming a semiconductor device structure of claim 1, wherein the portion of the conductive layer is removed by an etching process using the first spacer, the second spacer, the first dielectric structure and the second dielectric structure as a mask, and the semiconductor substrate is exposed after the etching process is performed.

4. The method for forming a semiconductor device structure of claim 1, wherein a bottom portion of the third spacer is connected to a bottom portion of the fourth spacer, and an upper portion of the third spacer is separated from an upper portion of the fourth spacer.

5. The method for forming a semiconductor device structure of claim 1, wherein the third spacer and the fourth spacer extend between the first conductive structure and the second conductive structure such that a top surface of the first conductive structure is higher than a bottom surface of the third spacer and a bottom surface of the fourth spacer.

6. The method for forming a semiconductor device structure of claim 1, further comprising:

forming a first dielectric layer over a sidewall of the first conductive structure and a second dielectric layer over a sidewall of the second conductive structure by a heat treatment process before the third spacer and the fourth spacer are formed.

7. The method for forming a semiconductor device structure of claim 6, wherein the first dielectric layer is covered by the first spacer and the second dielectric layer is covered by the second spacer, and the air gap is enclosed by the semiconductor substrate, the first dielectric layer, the second dielectric layer, the third spacer and the fourth spacer.

8. The method for forming a semiconductor device structure of claim 6, further comprising:

removing the first dielectric layer and the second dielectric layer to partially expose a bottom surface of the first spacer and a bottom surface of the second spacer before the third spacer and the fourth spacer are formed, wherein the third spacer extends to cover the bottom surface of the first spacer, and the fourth spacer extends to cover the bottom surface of the second spacer.

* * * * *